(12) United States Patent
El Fatimy et al.

(10) Patent No.: US 11,029,213 B2
(45) Date of Patent: Jun. 8, 2021

(54) EPITAXIAL GRAPHENE QUANTUM DOTS FOR HIGH-PERFORMANCE TERAHERTZ BOLOMETERS

(71) Applicants: Kurt Gaskill, Alexandria, VA (US); Georgetown University, Washington, DC (US); U.S. Naval Research Laboratory, Washington, DC (US)

(72) Inventors: Abdel El Fatimy, Arlington, VA (US); Paola Barbara, Washington, DC (US); David Kurt Gaskill, Alexandria, VA (US)

(73) Assignees: Georgetown University, Washington, DC (US); The Government of the United States, as Repressented by the Secretary of the Navy, Arlington, VA (US)

( * ) Notice: Subject to any disclaimer, the term of this patent is extended or adjusted under 35 U.S.C. 154(b) by 336 days.

(21) Appl. No.: 15/780,132

(22) PCT Filed: Dec. 6, 2016

(86) PCT No.: PCT/US2016/065144
§ 371 (c)(1),
(2) Date: May 30, 2018

(87) PCT Pub. No.: WO2017/119978
PCT Pub. Date: Jul. 13, 2017

(65) Prior Publication Data
US 2020/0309602 A1 Oct. 1, 2020

Related U.S. Application Data

(60) Provisional application No. 62/264,046, filed on Dec. 7, 2015.

(51) Int. Cl.
*G01J 5/20* (2006.01)
*G01J 5/02* (2006.01)
(Continued)

(52) U.S. Cl.
CPC .............. *G01J 5/20* (2013.01); *G01J 5/023* (2013.01); *G01J 5/0837* (2013.01);
(Continued)

(58) Field of Classification Search
CPC . G01J 5/20; G01J 5/023; G01J 5/0837; H01L 29/127; H01L 29/267; H01L 29/45; H01L 29/66992
See application file for complete search history.

(56) References Cited

U.S. PATENT DOCUMENTS 5,915,194 A    6/1999  Powell et al. ............... 438/478
2009/0015491 A1*  1/2009  Ikeda ..................... G01J 5/08
                                                    343/703

(Continued)

FOREIGN PATENT DOCUMENTS

WO    WO 2015/102746    7/2015    ............. H01L 29/43

OTHER PUBLICATIONS

Yan, J., et al., "Dual-Gated Bilayer Graphene Hot-Electron Bolometer," Nature Nanotechnology 7, 472-478, doi:10.1038/nnano.2012.88, 2012.

(Continued)

*Primary Examiner* — Blake C Riddick
(74) *Attorney, Agent, or Firm* — Dawn-Marie Bey; Bey & Cotropia PLLC

(57) ABSTRACT

Devices including graphene quantum dots yield extremely high performance THz bolometers, by measuring the current of hot electrons formed in the graphene source and drain electrodes of the device and propagating through the graphene quantum dot connected thereto. Devices may also (Continued)

include additional materials such as $MoS_2$, as well as one or more gate electrodes to alter performance as needed.

10 Claims, 20 Drawing Sheets

(51) Int. Cl.
    *G01J 5/08*     (2006.01)
    *H01L 29/12*     (2006.01)
    *H01L 29/267*     (2006.01)
    *H01L 29/45*     (2006.01)
    *H01L 29/66*     (2006.01)

(52) U.S. Cl.
    CPC .......... *H01L 29/127* (2013.01); *H01L 29/267* (2013.01); *H01L 29/45* (2013.01); *H01L 29/66992* (2013.01)

(56) References Cited

U.S. PATENT DOCUMENTS

| | | | |
|---|---|---|---|
| 2009/0280327 A1 | 11/2009 | Ying et al. | 428/405 |
| 2010/0184245 A1 | 7/2010 | Ouvrier-Buffet et al. | 438/59 |
| 2011/0227041 A1 | 9/2011 | Cho | 257/14 |
| 2012/0242831 A1* | 9/2012 | Restaino | G02B 26/06 348/135 |
| 2015/0235849 A1 | 8/2015 | Dimitrakopoulos et al. | H01L 21/02664 |
| 2017/0088944 A1* | 3/2017 | Sultana | C01B 32/194 |
| 2018/0047856 A1* | 2/2018 | Cai | H01L 31/1804 |
| 2018/0100767 A1* | 4/2018 | Pein | G01J 5/0815 |
| 2018/0315880 A1* | 11/2018 | Jadidi | H01G 9/2045 |

OTHER PUBLICATIONS

Han, Q., et al., "Highly Sensitive Hot Electron Bolometer Based on Disordered Graphene," Scientific Reports 3, doi: 10:1038/srep03533, 2013.

Cai, X., et al., "Sensitive Room-Temperature Terahertz Detection via the Photothermoelectric Effect in Graphene," Nature Nanotechnology 9, 814-819, doi: 10.1038/nnano.2014.182, 2014.

Tan, Y. W., Zhang, Y., Stormer, H. L., and Kim, P., "Temperature Dependent Electron Transport in Graphene," European Physical Journal-Special Topics, 148, 15-18, doi: 10.1140/epjst/e2007-00221-9, 2007.

Bolotin, K. I., Sikes, K. J., Hone, J., Stormer, H. L., and Kim, P., "Temperature-Dependent Transport in Suspended Graphene," Physical Review Letters 101, doi: 10.1103/PhysRevLett.101.096802, 2008.

Morozov, S. V., et al., "Giant Intrinsic Carrier Mobilities in Graphene and its Bilayer," Physical Review Letters 100, doi: 10.1103/PhysRevLett.100/016602, 2008.

Zhang, Y. B., et al., "Direct Observation of a Widely Tunable Bandgap in Bilayer Graphene," Nature 459, 820-823 doi: 10.1038/nature08105, 2009.

Yang, Y. F., et al., "Low Carrier Density Epitaxial Graphene Devices on SiC," Small 11, 90-95, doi: 10.1002/sml1.201400989, 2015.

Averin, D. V., Korotkov, A. N., and Likharev, K. K., "Theory of Single-Electron Charging of Quantum-Wells and Dots," Physical Review B 44, 6199-6211, doi: 10.1103/PhysRevB.44.6199, 1991.

Vicarelli, L., et al., "Graphene Field-Effect Transistors as Room-Temperature Terahertz Detectors," Nature Materials 11, 865-871, doi: 10.1038/nmat3417, 2012.

Richards, P. L., "Bolometers for Infrared and Millimeter Waves," Journal of Applied Physics 76, 1-24, doi: 10.1063/1.357128, 1994.

Karasik, B. S., McKitterick, C. B., and Prober, D. E., "Prospective Performance of Graphene HEB for Ultrasensitive Detection of Sub-mm Radiation," Journal of Low Temperature Physics 176, 249-254, doi: 10.1007/s10909-014-1087-7, 2014.

Boppel, S., Lisauskas, A., Krozer, V., and Roskos, H. G., "Performance and Performance Variations of Sub-1 THz Detectors Fabricated With 0.15 μm CMOS Foundry Process," Electronics Letters 47, 661-662, doi: 10.1049/31.2011.0687, 2011.

Karasik, B. S., Sergeev, A. V., and Prober, D. E., "Nanobolometers for THz Photon Detection," IEEE Transactions on Terahertz Science and Technology 1, 97-111, doi: 10.1109/tthz.2011.2159560, 2011.

McKitterick, C. B., Prober, D. E. Vora, H., and Du, X., "Ultrasensitive Graphene Far-Infrared Power Detectors," Journal of Physics-Condensed Matter 27, doi: 10.1088/0953-8984/27/16/164203, 2015.

Yakes, M. K., et al., "Conductance Anisotropy in Epitaxial Graphene Sheets Generated by Substrate Interactions," Nano Letters 10, 1559-1562, doi: 10.1021/nl9035302, 2010.

Ponomarenko, L. A., et al., "Chaotic Dirac Billiard in Graphene Quantum Dots," Science 320, 356-358, doi: 10.1126/science.1154663, 2008.

Guttinger, J., et al., "Transport Through Graphene Quantum Dots," Reports on Progress in Physics 75, doi: 10.1088/0034-4885/75/12/126502, 2012.

Droescher, S., Knowles, H., Meir, Y., Ensslin, K., and Ihn, T., "Coulomb Gap in Graphene Nanoribbons," Physical Review B 84, doi: 10.1103/PhysRevB.84.073405, 2011.

Stampfer, C., et al., "Energy Gaps in Etched Graphene Nanoribbons," Physical Review Letters 102, doi: 10.1103/PhysRevLett.102.056403, 2009.

Rinzan, M., Jenkins, G., Drew, H. D., Shafranjuk, S., and Barbara, P., "Carbon Nanotube Quantum Dots as Highly Sensitive Terahertz-Cooled Spectrometers," Nano Letters 12, 3097-3100, doi: 10.1021/nl300975h, 2012.

Mendis, R., et al., "Spectral Characterization of Broadband THz Antennas by Photoconductive Mixing: Toward Optimal Antenna Design," IEEE Antennas and Wireless Propagation Letters 4, 85-88, doi: 10.1109/lawp.2005.844650, 2005.

Fong, K. C. and Schwab, K. C., "Ultrasensitive and Wide-Bandwidth Thermal Measurements of Graphene at Low Temperatures," Physical Review X 2, doi: 10.1103/PhysRevX.2.031006, 2012.

Wang, Z., Bi, K., Guan, H., and Wang, J., "Thermal Transport Between Graphene Sheets and SiC Substrate by Molecular-Dynamical Calculation," Journal of Materials 2014, 5, doi: 10.1155/2014/479808, 2014.

Viljas, J. K. and Heikkila, T. T., "Electron-Phonon Heat Transfer in Monolayer and Bilayer Graphene," Physical Review B 81, doi: 10.1103/PhysRevB.81.245404, 2010.

Chen, J. H., Jang, C., Xiao, S. D., Ishigami, M., and Fuhrer, M. S., "Intrinsic and Extrinsic Performance Limits of Graphene Devices on SiO2," Nature Nanotechnology 3, 206-209, doi: 10.1038/nnano.2008.58, 2008.

Betz, A. C., et al., "Hot Electron Cooling by Acoustic Phonons in Graphene," Physical Review Letters 109, doi: 10.1103/PhysRevLett.109.056805, 2012.

Nyakiti, L. O., et al., "Enabling Graphene-Based Technologies: Toward Wafer-Scale Production of Epitaxial Graphene," Mrs. Bulletin 37, 1149-1157, doi: 10.1557/mrs.2012.180, 2012.

L. P. Kouwenhoven, C. M. Marcus, P. L. McEuens, S. Tarucha, R. M. Westervelt, S. Wingreen, "Electron Transport in Quantum Dots," in: L. L. Sohn, L. Kouwenhoven, P., G. S. Schon (Eds.), NATO Advanced Study Institute on Mesoscopic Electron Transport, Kluwer, Cuarcao, Netherlands Antilles, 1996.

G. Christou, D. Gatteschi, D. N. Hendrickson, R. Sessoli, "Single-Molecule Magnets," Mrs. Bulletin, 25, 66-71, 2000.

A. Ardavan, O. Rival, J. J. L. Morton, S. J. Blundell, A. M. Tyryshkin, G. A. Timco, R. E. P. Winpenny, "Will Spin-Relaxation Times in Molecular Magnets Permit Quantum Information Processing?," Physical Review Letters, 98, 2007.

N. Leuenberger, D. Loss, "Quantum Computing in Molecular Magnets," Nature, 410, 789-793, 2001.

M. Pineda, N. F. Chilton, R. Marx, M. Dorfel, D. O. Sells, P. Neugebauer, S. D. Jiang, Collison, J. van Slageren, E. J. L. McInnes, R. E. P. Winpenny, "Direct Measurement Nature Dysprosium (III) . . . Dysprosium(III) Interactions in a Single-Molecule Magnet," Communications, 5, 2014.

(56) References Cited

OTHER PUBLICATIONS

K. Bader, D. Dengler, S. Lenz, B. Endeward, S. D. Jiang, P. Neugebauer, J. van Slageren, "Room Temperature Quantum Coherence in a Potential Molecular Qubit," Nature Communications, 5, 2014.
Y.Y. Zhu, T. T. Yin, S. D. Jiang, Al. L. Barra, W. Wernsdorfer, P. Neugebauer, R. Marx, M. Dorfel, B. W. Wang, Z. Q. Wu, J. van Slageren, S. Gao, "The Solvent Effect in an Axially Symmetric Fe-4(III) Single-Molecule Magnet," Chemical Communications, 50, 15090-15093, 2014.
L. Bogani, W. Wernsdorfer, "Molecular Spintronics Using Single-Molecule Magnets," Nature Materials, 7, 179-186, 2008.
A. Boyd, I. Dube, G. Federov, M. Paranjape, P. Barbara, "Gas Sensing Mechanism of Carbon Nanotubes: From Single Tubes to High-Density Networks," Carbon, 69, 417-423, 2014.
J. Zhang, A. Boyd, A. Tselev, M. Paranjape, P. Barbara, "Mechanism of NO2 Detection in Carbon Nanotube Field Effect Transistor Chemical Sensors," Applied Physical Letters, 88, 2006.
W. Wang, A. Klots, D. Prasai, Y. Yang, K. Bolotin, J. Valentine, "Hot Electron-Based Near Infrared Photodetection Using Bilayer MoS2," Nano Letters, 2015.
M. Bernardi, M. Palummo, J. C. Grossman, "Extraordinary Sunlight Absorption and One Nanometer Thick Photovoltaics Using Two-Dimensional Monolayer Materials," Nano Letters 13, 3664-3670, 2013.
K. Roy, M. Padmanabhan, S. Goswami, T. P. Sai, G. Ramalingam, S. Raghavan, A. Ghosh, "Graphene-MoS2 Hybrid Structures for Multifunctional Photoresponsive Memory Devices," Nature Nanotechnology, 8, 826-830, 2013.
S. Rathi, I. Lee, D. Lim, J. W. Wang, Y. Ochiai, N. Aoki, K. Watanabe, T. Taniguchi, G. H. Lee, Y. J. Yu, P. Kim, G. H. Kim, "Tunable Electrical and Optical Characteristics in Monolayer Graphene and Few-Layer MoS2 Heterostructure Devices," Nano Letters, 15, 5017-5024, 2015.
X. Cui, G. H. Lee, Y. D. Kim, G.Arefe, P. Y. Huang, D. H. Lee, D. A. Chenet, X. Zhang, L. Wang, F. Ye, F. Pizzocchero, B. S. Jessen, K. Watanabe, T. Tanigushi, D. A. Muller, T. Low, P. Kim, J. Hone, "Multi-Terminal Transport Measurements of MoS2 Using a van der Waals Heterostructure Device Platform," Nature Nanotechnology, 10, 534-540, 2015.
L. Bitnell, R. M. Ribeiro, A. Eckmann, R. Jalil, B. D. Belle, A. Mischenko, Y. J. Kim, R. V. Gorbachev, T. Georgiou, S. V. Morozov, A. N. Grigorenko, A. K. Geim, C. Casiraghi, A. H. Castro Neto, K. S. Novoselov, "Strong Light-Matter Interactions in Heterostructures of Atomically Thin Films," Science, 340, 1311-1314, 2013.
M. Fontana, T. Deppe, A. K. Boyd, M. Rinzan, A. Y. Liu, M. Paranjape, P. Barbara, "Electron-Hole Transport and Photovoltaic Effect in Gated MoS2 Schottky Junctions," Scientific Reports, 3, 2013.
Z. Yin, H. Li, H. Li, L. Jiang, Y. Shi, Y. Sun, G. Lu, Q. Zhang, X. Chen, H. Zhang, "Single-Layer MoS2 Phototransistors," Acs. Nano., 6, 74-80, 2012.
O. Lopez-Sanchez, D. Lembke, M. Kayci, A. Radenovic, A. Kis, "Ultrasensitive Photodetectors Based on Monolayer MoS2," Nature Nanotechnology, 8, 497-501, 2013.
C. Chen, H. Qiao, S. Lin, C. M. Luk, Y. Liu, Z. Xu J. Song, Y. Xue, D. Li, J. Yuan, W. Yu, C. Pan. S. P. Lau, Q. Bao, "Highly Responsive MoS2 Photodetectors Enhanced by Graphene Quantum Dots," Scientific Reports, 5, 2015.
M. Shanmugam, C. A. Durcan, B. Yu, "Layered Semiconductor Molybdenum Disulfide Nanomembrane Based Schottky-Barrier Solar Cells," Nanoscale, 4 , 7399-7405, 2012.
S. Wi, H. Kim, M. K. Chen, H. Nam, L. J. Guo, E. Meyhofer, X. G. Liang, Enhancement of Photovoltaic Response in Multilayer MoS2 Induced by Plasma Doping, Acs. Nano, 8, 5270-5281, 2014.
Y. Yang, G. Federov, S. Shafranjuk, T. M. Klapwiji, B. K. Cooper, R. M. Lewis, C. J. Lobb, P. Barbara, "Electronic Transport and Possible Superconductivity at van Hove Singularities in Carbon Nanotubes," Nano Letters (accepted), 2015.
A. Carvalho, R. M. Ribeiro, A. H. Castro Neto, "Band Nesting and the Optical Response of Two-Dimensional Semiconducting Transition Metal Dichalcogenides," Physical Review B, 88, 2013.
International Search Report and Written Opinion for PCT Application No. PCT/US2016/065144, dated Sep. 15, 2017, 10 pp.
International Preliminary Report on Patentability for Application No. PCT/US2016/065144, dated Jun. 12, 2018, 6 pp.

* cited by examiner

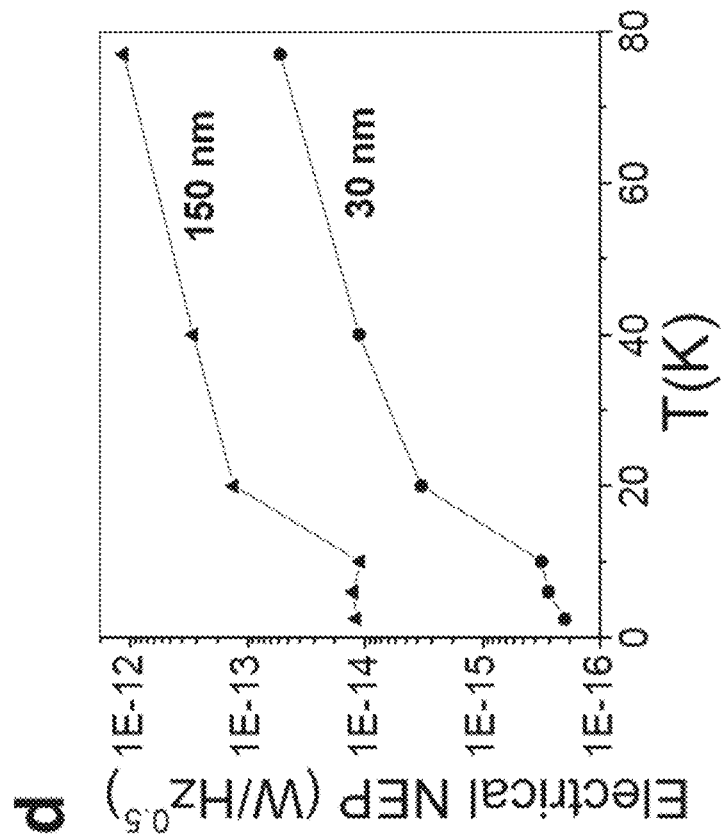
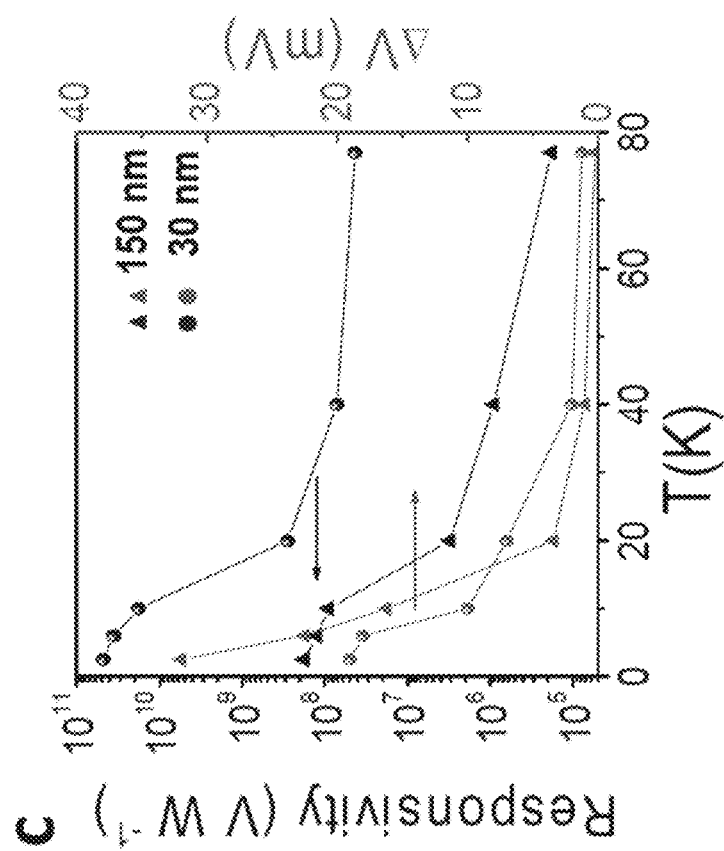
Figure 2d
Figure 2c

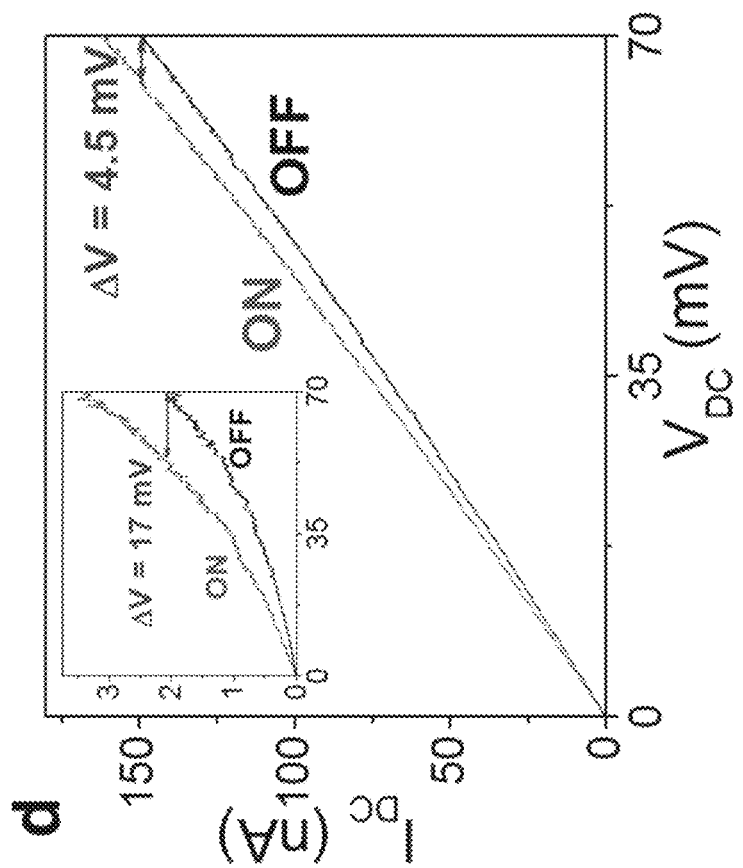
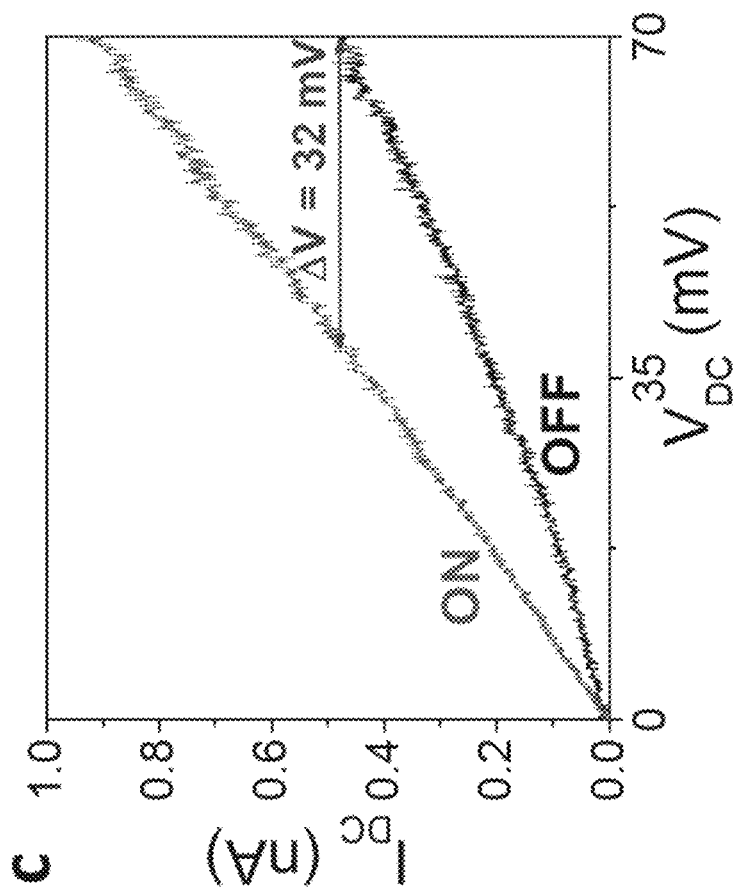
Figure 3c
Figure 3d

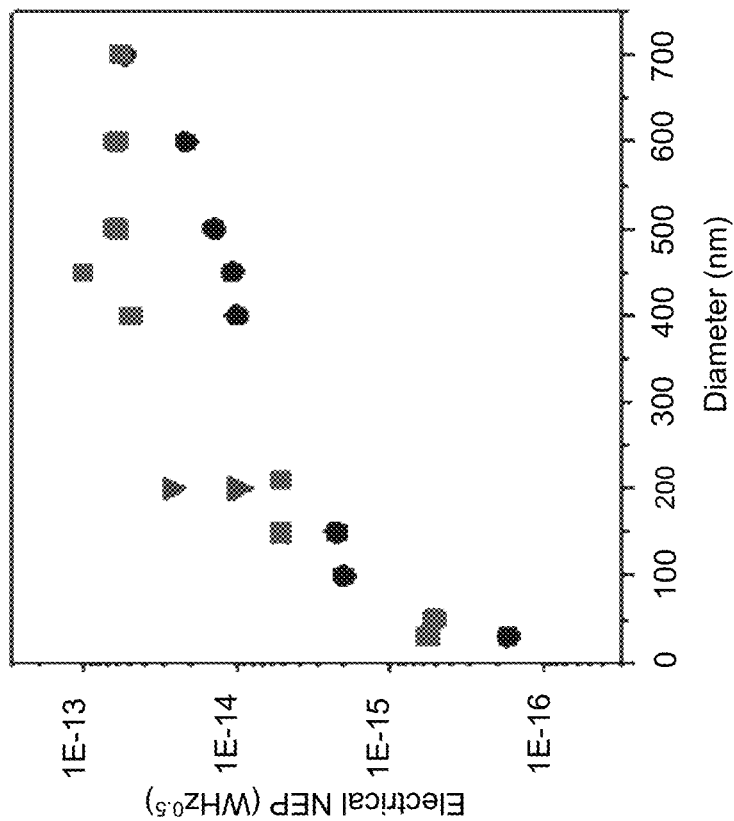
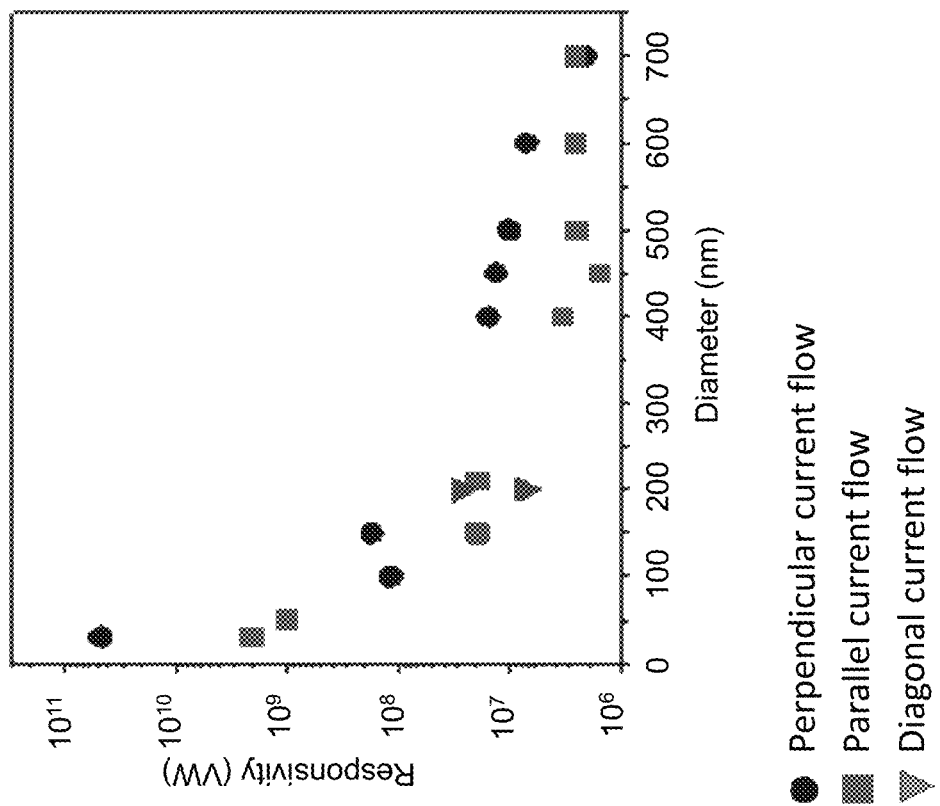
Figure 5a
Figure 5b
● Perpendicular current flow
▧ Parallel current flow
▷ Diagonal current flow

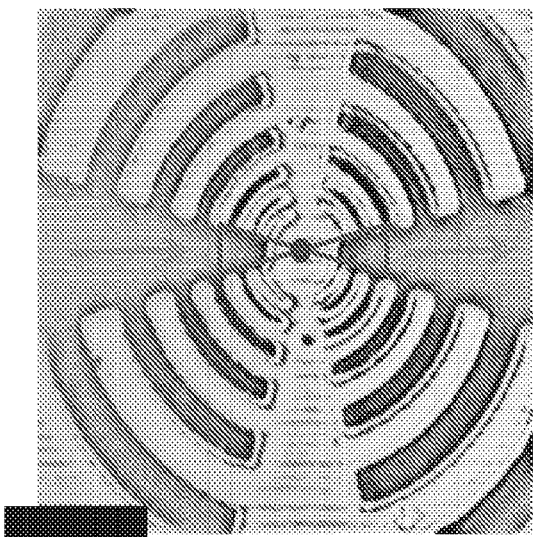
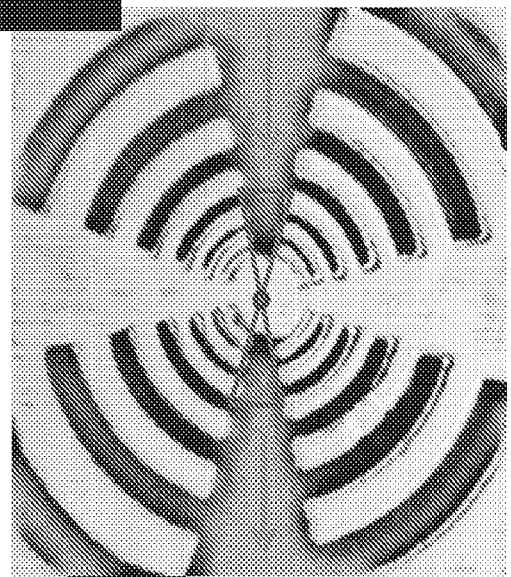
Figure 6a
Figure 6b

EPITAXIAL GRAPHENE QUANTUM DOTS FOR HIGH-PERFORMANCE TERAHERTZ BOLOMETERS

CROSS REFERENCE TO RELATED APPLICATIONS

The present application claims the benefit of priority to U.S. Provisional Patent Application No. 62/264,046 titled "Epitaxial Graphene Quantum Dots for High-Performance Terahertz Bolometers" which was filed on Dec. 7, 2015, the entire contents of which is incorporated herein by reference.

This invention was made with government support under N00014-13-1-0865 awarded by the U.S. Office of Naval Research and award number DURIP FA9550-09-1-0434 by the Air Force Office of Scientific Research. The government has certain rights in the invention.

FIELD OF THE EMBODIMENTS

The embodiments are generally directed to novel devices, including bolometers and photodetectors, and are more particularly descriptive of such devices formed using graphene.

BACKGROUND OF THE EMBODIMENTS

Materials with a layered structure similar to graphite, where the atoms within each layer are strongly bonded, but the layers are weakly coupled and can be easily separated, have become the focus of intense research efforts worldwide. This is because it is now possible to reduce their thickness down to a few or even a single layer to create atomically thin devices or transparent conductors that are suitable for flexible substrates. However, the full potential of their drastic reduction in thickness and their new physical properties due to quantum confinement has not yet been realized.

Light absorption in graphene causes a large change in electron temperature, due to low electronic heat capacity and weak electron phonon coupling. This property makes graphene a very attractive material for hot-electron bolometers in the terahertz frequency range. Unfortunately, the weak variation of electrical resistance with temperature results in limited responsivity for absorbed power.

As discussed in the prior art, the electrical resistivity of pristine graphene shows a weak temperature dependence, varying by less than 30% (200% for suspended graphene) from 30 mK to room temperature, because of the very weak electron-phonon scattering. A stronger temperature dependence was obtained either by using dual-gated bilayer graphene to create a tunable band gap, or by introducing defects to induce strong localization. Both schemes have successfully produced bolometric detection, with responsivities up to $2\times10^5$ VW$^{-1}$ and temperature coefficient for the resistance as high as 22 k$\Omega$K$^{-1}$ at 1.5 K[1,2]. These devices required the use of multilayer structures adding complexity. In the case of bilayer graphene, top and bottom gates were needed to electrically induce a bandgap. In the case of disordered graphene, a boron nitride layer was used as a tunneling barrier between the graphene and the electrodes to reduce thermal conductance due to diffusion of the electrons to the electrodes.

Accordingly, there is a need in the art for simplified graphene devices with improved temperature dependence and electrical response characteristics.

SUMMARY OF THE EMBODIMENTS

In a first exemplary embodiment, a hot-electron bolometer is described. The bolometer includes: a SiC substrate; a quantum dot pattern of epitaxial graphene formed on the SiC substrate; and a source electrode and drain electrode contacting the quantum dot pattern.

In a second exemplary embodiment, a hybrid structure bolometer is described. The hybrid structure bolometer includes: a SiC substrate; a pattern of epitaxial graphene formed on the SiC substrate; a single layer of MoS$_2$ transferred to the epitaxial graphene, wherein at least a portion of the pattern of epitaxial graphene and the single layer of MoS$_2$ overlap; and a source electrode and drain electrode each contacting one of the pattern of epitaxial graphene and the single layer of MoS$_2$.

BRIEF DESCRIPTION OF THE FIGURES

The following figures illustrates various features of the present embodiments.

FIGS. 2a-2d illustrate terahertz response of graphene dots;

FIGS. 3a-3d illustrate temperature dependence and effect of dot orientation with respect to SiC steps;

FIGS. 5a-5b illustrate bolometric performance vs. dot diameter and orientation;

FIGS. 6a-6b illustrate SiC terraces and device orientation;

DETAILED DESCRIPTION OF THE EMBODIMENTS

Certain embodiments described herein are directed to applications of novel photodetectors based on quantum confinement of graphene, a single layer of graphite, and single-layer MoS$_2$, a semiconducting material with a layered structure similar to graphene. Various embodiments further reduce their dimensions by nanostructuring single layers, to create high-performance photodetectors.

Graphene has material properties that are ideal for bolometric application: small electronic heat capacity and weak electron-phonon coupling, making it easy to create hot electrons with the incident electromagnetic radiation. The present embodiments demonstrate that graphene quantum dots can yield extremely high performance THz bolometers, by measuring the current of hot electrons formed in the graphene source and drain electrodes and propagating through the graphene quantum dot connected to them. Building on this demonstration, the embodiments may be used to create numerous useful devices.

The embodiments described herein exploit quantum transport and properties that are unique to the identified two-dimensional materials for novel devices that can be used in many fields, from THz imaging and spectroscopy to molecular spintronics.

Due to quantum confinement, quantum dots of epitaxial graphene on SiC exhibit an extraordinarily high variation of resistance with temperature (higher than 430 MΩK$^{-1}$ below 6 K), leading to responsivities of $1\times10^{10}$ VW$^{-1}$, a figure that is five orders of magnitude higher than other types of graphene hot-electron bolometers. The high responsivity combined with an extremely low electrical noise-equivalent power (about $2\times10^{-16}$ W/√Hz at 2.5 K), places the embodied bolometers well above commercial cooled bolometers. Additionally, it is shown that these quantum dot bolometers possess good performance at temperatures as high as 77 K.

The embodiments contemplate hot-electron bolometric detection using nano-patterned dots of epitaxial graphene. A bandgap is induced via quantum confinement, without the need for gates, using a simple single-layer structure. The THz response of dots with diameters varying from 30 nm to 700 nm, at 0.15 THz for the temperature range 2.5 to 80 K is discussed. These devices are extremely sensitive and the responsivity increases by decreasing the dot diameter, with the smaller dots still showing a clear response at liquid nitrogen temperature. The fabrication process is fully scalable and easily provides multiple devices on the same chip, making it suitable for bolometer arrays. Moreover, its flexibility allows patterning of arrays of dots electrically connected in parallel, to control the device impedance while preserving the strong temperature dependence (see FIG. 15).

Figures 1A, 1B, 1C:
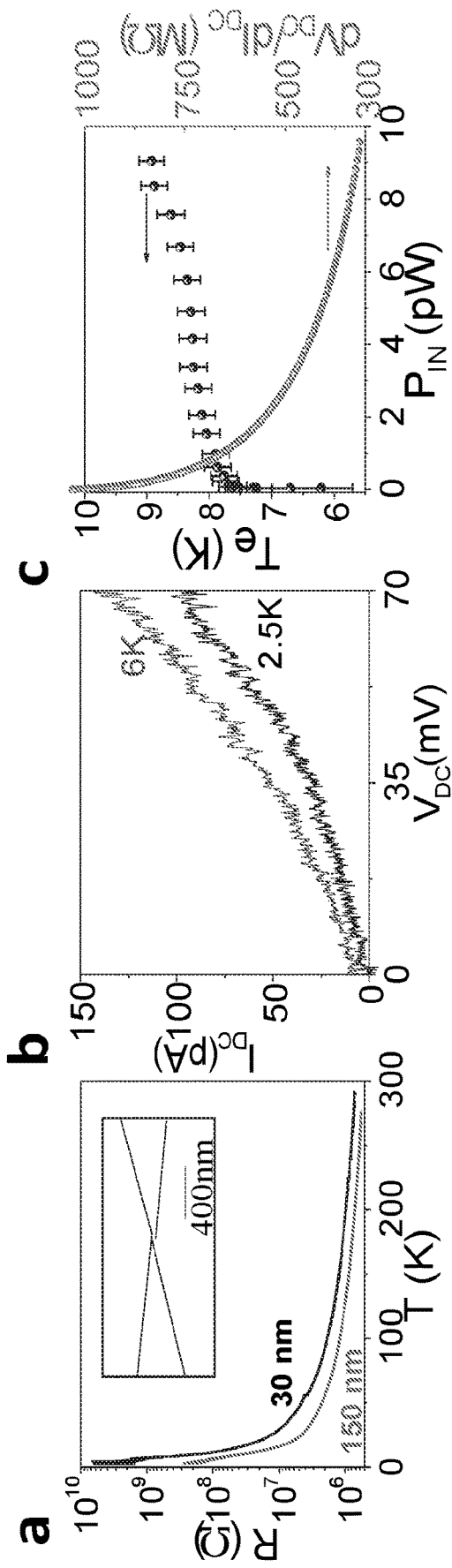
FIGS. 1a-1c illustrates temperature and electrical power characterizations of graphene quantum dots.

Dots were fabricated using e-beam lithography and a process developed by Yang et al. on epitaxial graphene (see Methods). The Yang process is discussed in Yang, Y. F. et al. Low Carrier Density Epitaxial Graphene Devices On SiC. *Small* 11, 90-95, doi:10.1002/smll.201400989 (2015), which is incorporated herein by reference. FIG. 1a shows an image of a typical quantum dot and the temperature dependence of the resistance for a couple of dots. The resistance varies strongly, by almost four orders of magnitude for the 30 nm dot and two orders of magnitudes for the 150 nm dot over a temperature range of 4 to 300 K; for the case of the 30 nm dots, the temperature coefficient is about 430 MΩK$^{-1}$ at 6 K. This value is likely higher below 6 K, but we cannot measure it accurately, due to the small signal-to-noise ratio for the current in this temperature range. For this measurement we keep the voltage bias constant and at a low value, below 5 mV, to avoid Joule heating. When the temperature is lowered below 6 K, the sharp increase of resistance causes the current signal to drop dramatically. Inset in FIG. 1a is an SEM image of a typical quantum dot.

The current-voltage (IV) characteristics are non-linear, as shown in FIG. 1b. Typical IV curves of quantum dots with similar tunnel barriers between the dot and the source and drain electrodes exhibit a low current region around zero bias, corresponding to the Coulomb blockade region, and a linear IV above the Coulomb blockade threshold[9]. However, these models do not include Joule heating, which could be significant in our high-resistance samples. If we assume that the non-linearity is solely due to Joule heating and the strong temperature dependence of the resistance, we can directly estimate the expected bolometric performance. By using the measured temperature dependence of the resistance and the differential resistance $R=dV_{DC}/dI_{DC}$ as a function of $P_{IN}=V_{DC}\times I_{DC}$ (see FIG. 1c), we can extract the electron temperature vs. the electrical power absorbed by the device. The result for a 30-nm dot at the base temperature of 6 K is shown in FIG. 1c, yielding a thermal conductance $dP_{IN}/dT_e=G_{TH}\sim7\times10^{-12}$ WK$^{-1}$ in the range 1.5 pW<$P_{IN}$<10 pW. We can also estimate the device intrinsic speed from the thermal time constant, $\tau=C_e/G_{TH}$<2.5 ns, where $C_e$ is the electronic heat capacity.

The electrical responsivity r is the change in voltage across the device divided by the absorbed power at a fixed bias current. It is directly related to the temperature dependence of the resistance and the thermal conductance, $G_{TH}$, according to $$r = \frac{\Delta V_{DC}}{\Delta P_{IN}} = I_{DC}\frac{\Delta R}{\Delta P_{IN}} = I_{DC}\frac{\Delta R}{\Delta T}\frac{1}{G_{TH}} \quad (1)$$

We can estimate the expected bolometric responsivity from the plot of resistance as a function of electrical power. For example, by using the $R(P_{IN})=dV_{DC}/dI_{DC}(P_{IN})$ curve in FIG. 1c, at $P_{IN}=0.45$ pW, corresponding to $I_{DC}\sim25$ pA from FIG. 1b, we find $r=0.65\times10^{10}$ VW$^{-1}$ for a 30 nm dot at 6K. This is indeed orders of magnitude higher than any value previously reported for graphene detectors.

Figure 2B:
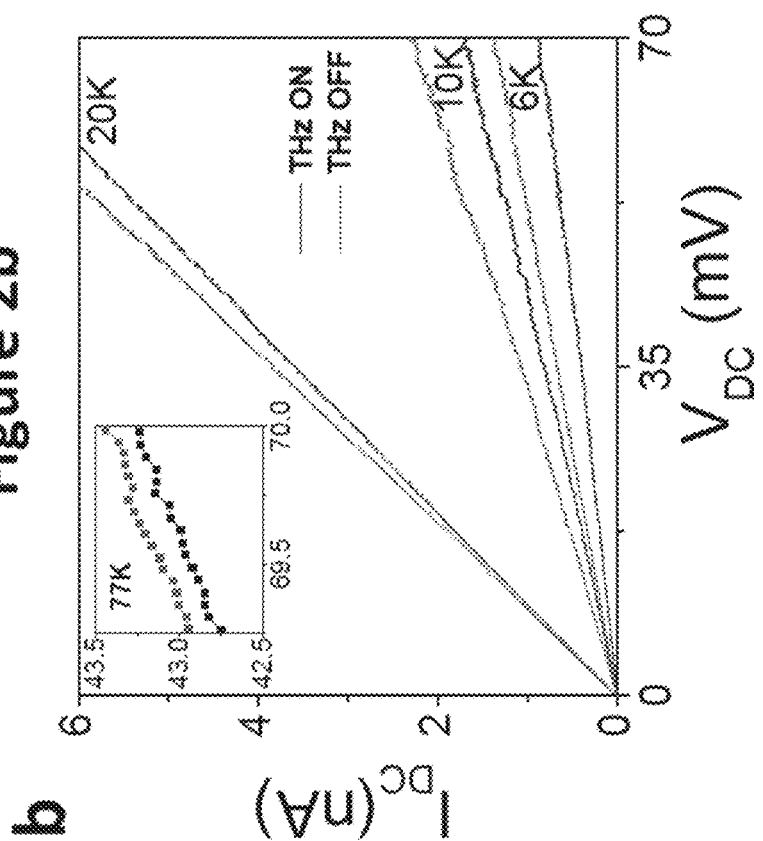
Figure 2A:
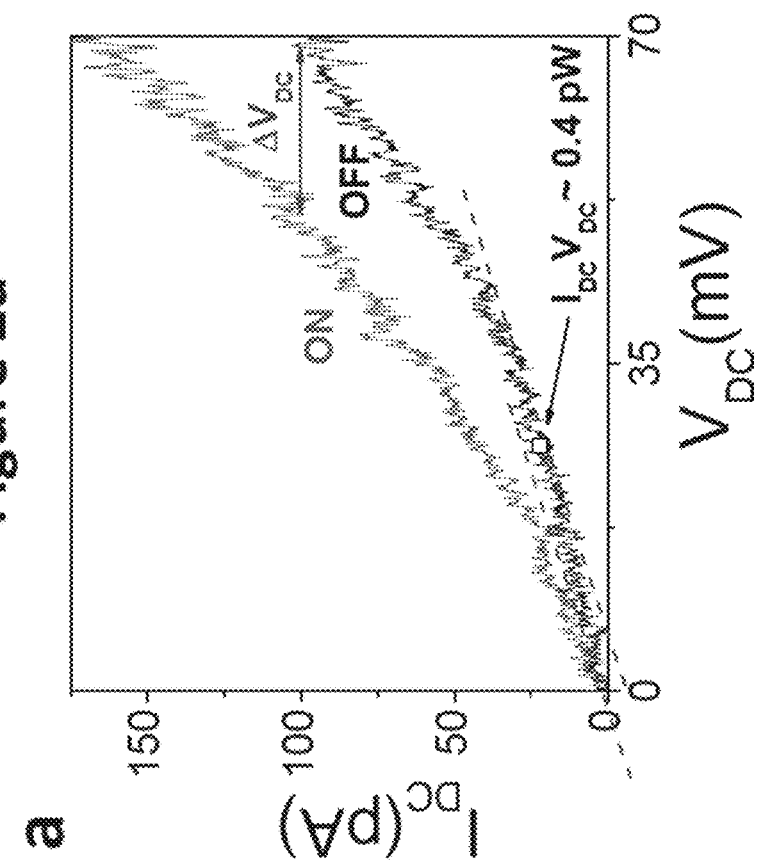

The bolometric performance estimated above is based on Joule heating. Next, we measure the bolometric performance of the dots with incident 0.15 THz radiation from a backward wave oscillator (BWO). FIG. 2a shows the response of the same 30-nm dot characterized in FIG. 1. The change in the current voltage characteristic due to THz radiation is very similar to the change caused by heating (compare FIG. 1b and FIG. 2a). We extract the absorbed THz power by measuring the electrical power at the point in the dark (OFF) current-voltage characteristic with the same differential resistance as the zero-bias differential resistance of the current-voltage characteristic with radiation on (ON), as shown in FIG. 2a, corresponding to about 0.4 pW for this 30-nm dot. The voltage change $\Delta V_{DC}$ at 2.5 K due to THz radiation is about 20 mV at 100 pA, yielding, indeed, an extremely high electrical responsivity, $r=5\times10^{10}$ VW$^{-1}$, consistent with the high responsivity estimates based on Joule heating. The response of the same device at 6 K is shown in FIG. 5b.

One important characteristic of bolometric sensors is the noise equivalent power (NEP), which is the lowest detectable power in a 1 Hz output bandwidth. Because of this extraordinarily high responsivity, the contribution of Johnson-Nyquist (JN) noise to the noise equivalent power is extremely small, notwithstanding the high device resistance. Other sources of noise that are intrinsic to the bolometer and do not depend on the measurement circuit are shot noise (SN) and thermal fluctuations (TF). We estimate the shot noise from the device $I_{DC}$ at the bias point where we measure the response $\Delta V_{DC}$ and the noise due to thermal fluctuations using the thermal conductance extracted from the electrical characteristics of each device. The total NEP is given by $NEP^2=NEP^2_{JN}+NEP^2_{SN}+NEP^2_{TF}=(4\ k_BTR)/r^2+(2eI_{DC})R^2/r^2+4\ k_BT^2G_{TH}$. We note that this NEP is evaluated from the electrical characteristics of the bolometers and from the responsivity based on absorbed power, rather than incident power. This means that it reflects the intrinsic performance limits of the device, without considering the coupling to THz radiation via antennas and the measurement circuit. For this reason, we will refer to it as electrical NEP. The NEP that includes the coupling to antenna and measurement circuit is the optical NEP, which is typically higher than the electrical NEP. The plot of the total electrical NEP as a function of temperature calculated for a 30-nm and a 150-nm dot is in FIG. 2d and the responsivity in FIG. 2c. The devices show remarkable performance up to 77 K, with electrical NEP at least one order of magnitude lower (for the 30 nm dot at 2.5 K) than the best commercial cooled bolometers and much faster response time (a few nanoseconds, compared to milliseconds for commercial bolometers). The 2.5 K bolometric performance measured as a function of the dot diameter for several devices is shown in FIG. 5. Although nanobolometers based on superconducting transition edge sensors may outperform the embodied quantum dot bolometers in terms of NEP, they only operate in a narrow temperature range around the superconducting transition temperature and at much lower temperatures.

As mentioned above, the strong temperature dependence of the resistance is the key property that produces a dramatic increase of the responsivity. The embodied quantum dots are made of epitaxial graphene on SiC. The SiC substrate surface has basal plane terraces bounded by steps defined by (11-2n) family of facets. It has been found that the orientation of the dots with respect to the steps significantly affects their resistance: the devices show higher resistance when the current flows perpendicular to the steps. Anisotropic conductivity due to local scattering at the step edges of the SiC substrates has been observed before and it was proposed that the anisotropy was due to Si atoms trapped at the steps.

Figures 3A, 3B:
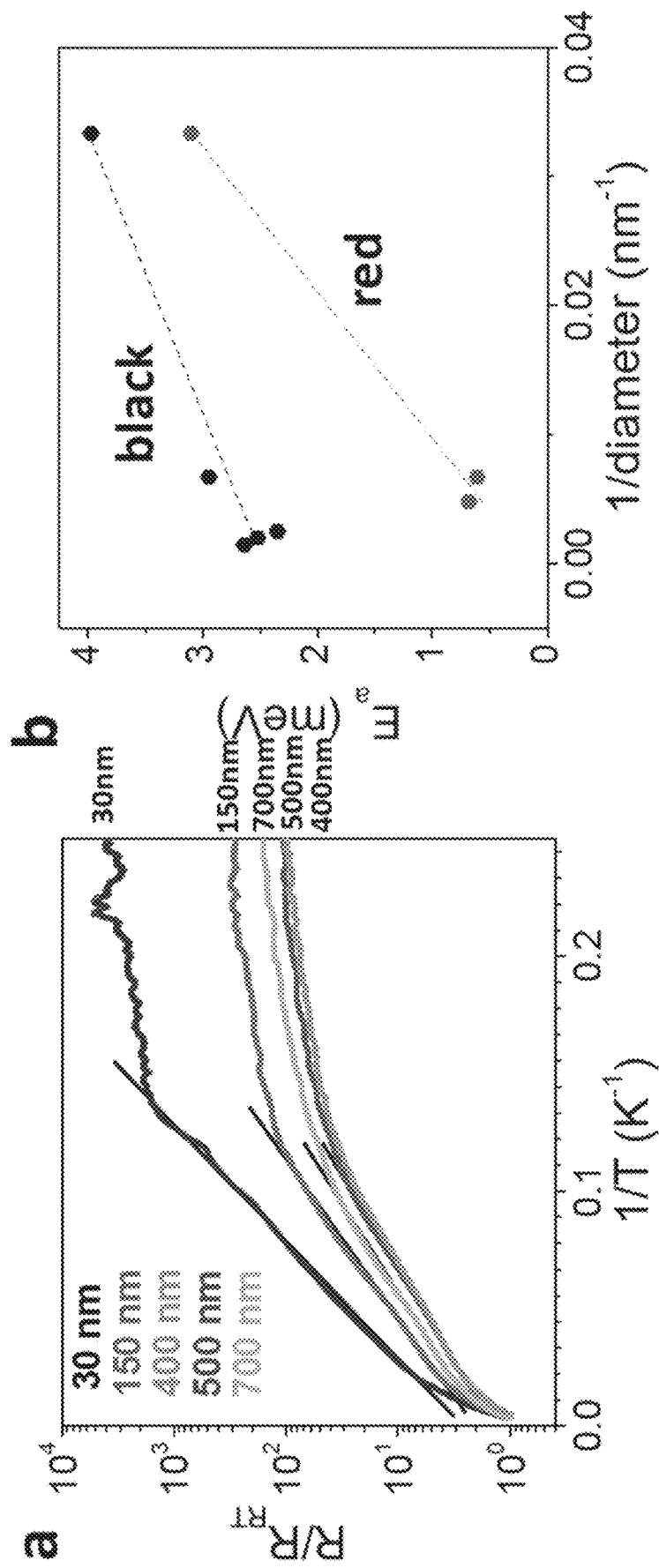

FIG. 3a shows the temperature dependence of the resistance for dots of different diameter that are patterned with current flowing perpendicular to the steps. Regardless of dot orientation and size, the curves could not be fit to a simple function in the temperature range from room temperature to 2.5 K. However, the curves for all the dot sizes and orientations show a good fit to thermal activation, in the range 9 K<T<60 K, as shown in FIG. 3a. The activation energies extracted from these fits are in FIG. 3b. The black (red) circles correspond to dots with steps perpendicular (parallel) to the direction of the current flow. The activation energies are roughly proportional to the inverse of the dot diameter. This is consistent with quantum dots from exfoliated graphene, where the combination of the charging energy and the electronic level spacing open a bandgap (confinement gap) that is inversely proportional to the dot diameter. Another notable feature in FIG. 3b is that the black circles clearly show an upward energy shift of about 1 meV. The effect of the substrate on the energy gap of nanostructured graphene has been previously observed in etched graphene nanoribbons, where the disorder potential substantially increased the conductance gap induced by quantum confinement. Here, the steps between the terraces also change the potential landscape of the dots, introducing additional conductance barriers having the same orientation as the steps.

When a bias voltage is applied across the dot, the current is dominated by thermal activation over a potential barrier. When radiation is incident on the bolometer, the electron temperature in the whole graphene area (including the graphene on either side of the dot) increases and the current also increases. Both the quantum confinement gap and the potential barriers from the steps in the substrate contribute to the overall barrier height. The activation energy can therefore be tailored by varying the size of the dot or by applying a gate voltage. There is no gate electrode in this example; therefore the alignment of the Fermi energy within the confinement gap is not controlled. Nevertheless, the activation energies show a regular dependence on the dot diameter, suggesting that the whole chip is uniformly doped.

The epitaxial graphene quantum dots show exceptional responsivity and very low electrical NEP, in spite of their relatively simple structure. Discussed further herein are devices coupled to antennas and new designs tailored to maximize THz absorption in the graphene adjacent to the dot by increasing the detection area and improving the impedance mismatch with free space impedance. Devices may be improved by observing Coulomb blockade patterns on gated dots, to separately extract all the characteristic energies and determine the effect of the substrate and its orientation with respect to the dot structure.

Estimate of Incident Power:

A Microtech backward-wave oscillator source with tunable frequency in the range 100-180 GHz has been used to estimate incident power. From the factory calibration curve, the output power at 0.15 THz is 25 mW. The THz radiation was focused within a 5.25 mm diameter circle using a Winston cone, giving an average power density of 1,155 $Wm^{-2}$. The distance between the end of the Winston cone and the surface of the SiC substrate where we patterned the dots was about 5 mm.

Figures 4A, 4B:
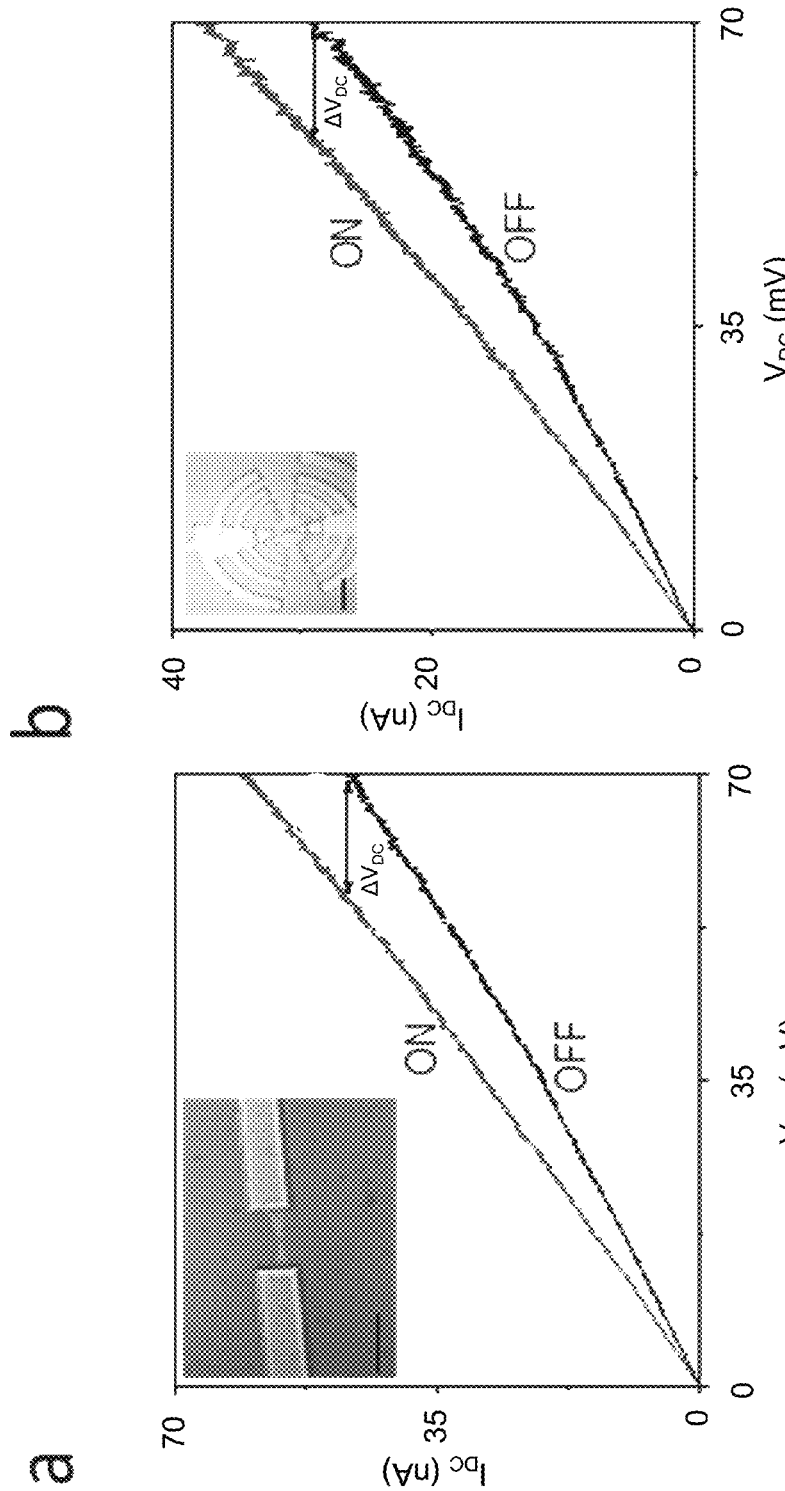
FIGS. 4a-4b illustrate response of graphene dots with and without antennas.

Two different types of designs were tested: without and with antennas, as shown in the images in the insets of FIG. 4a and FIG. 4b, also showing a comparison of the 0.15 THz (ON) response from 200-nm dots without and with antenna. For the devices with antennas (FIG. 4b), we used electrodes patterned as a log periodic antenna as source and drain electrodes designed to be broadband in the range from 0.7 THz to 4 THz. The initial measurements discussed herein are at 0.15 THz (ON), outside the antenna range, therefore it is not surprising that there is no notable increase of measured absorbed power for devices with antennas. Accordingly, it is determined that the electrodes do not play a major role in affecting the absorbed power at 0.15 THz.

Estimated power incident on the device is determined by using just the power incident on the graphene area between the electrodes (the dot pattern), roughly 20 $\mu m^2$ for most devices, yielding 23 nW (37 nW for a couple of devices with 32 $\mu m^2$ graphene area—see Table 1). A detailed list for 19 samples is shown in Table 1. The absorbed power is measured from the 0.15 THz response of 19 devices with different dot diameter and different orientation with respect to the SiC steps. For most devices the absorbed power ranges from 30 pW to 300 pW, two to three orders of magnitude smaller than the estimated incident power. For the 5 devices outside this range, the 3 with lower absorbed power are smaller, higher resistance dots and the 2 with higher power are dots with larger graphene area and diagonal steps.

The absorbed power also varies depending on the position of the devices, indicating that the power from the Winston cone is non-uniform. Variations may also be due to variations in the output power of the source corresponding to slightly different operating parameters (cathode current and heater current) during different measurements runs.

Additional measurement may focus on increasing the coupling between the THz radiation and the devices by using antennas designed to increase the detection area and improve the impedance mismatch, for example by including shunt capacitors to reduce the device impedance at THz frequency.

TABLE 1

| Samples 8 × 8 mm² | Graphene area (μm²) | Dot diameter (nm) | Orientation to SiC steps | Absorbed power (pW) |
|---|---|---|---|---|
| 3DN3 | 20 | 100 | perpendicular | 200 |
| 16D11 | 20 | 30 | perpendicular | 0.4 |
|  |  | 30 | Perpendicular | 8 |
|  |  | 50 | perpendicular | 7 |
|  |  | 150 | perpendicular | 180 |
|  |  | 150 | parallel | 224 |
|  |  | 400 | perpendicular | 43.5 |
|  |  | 450 | perpendicular | 58.9 |
|  |  | 500 | perpendicular | 67.5 |
|  |  | 600 | perpendicular | 164 |
|  |  | 700 | perpendicular | 187 |
| 14D13 | 20 | 210 | parallel | 170 |
|  |  | 400 | parallel | 147 |
|  |  | 450 | parallel | 123 |
|  |  | 500 | parallel | 193 |
|  |  | 600 | parallel | 186 |
|  |  | 700 | parallel | 190 |
| 27ER4 | 32 | 200 | diagonal | 500 |
|  |  | 200 | diagonal | 2000 |

Estimate of Device Speed:

The speed of the device is determined by the thermal time constant, $\tau = C_e/G_{TH}$, where the electronic heat capacity $C_e = (2\pi^{3/2} k_B^2 n^{1/2} T_e)/(3\hbar v_F)$, n is the carrier density and $v_F$ is the Fermi velocity. We do not know the doping of graphene after the nanopatterning process, however, for a typical carrier density $n=10^{12}$ cm$^{-2}$, we estimate $C_e < 9 \times 10^{-22}$ J/(Kμm²) for $T_e < 9$ K, leading to a response time smaller than 2.5 ns (the area of our patterned graphene is about 20 μm²). This estimate is for the intrinsic response time of the device. The specific measurement circuit used to detect the response will significantly increase the response time from this value.

Performance as a Function of Dot Diameter and Orientation:

Several devices with different diameter and current flow orientation with respect to the SiC steps have been measured as exemplified in Table 1. The best performance is for dot diameter smaller than 200 nm and device orientation with current flow perpendicular to the SiC steps. The results are shown graphically in FIGS. 5a and 5b.

FIGS. 6a and 6b show transmission optical images of two devices revealing the terraces and showing different device orientation, parallel (FIG. 6a) and perpendicular (FIG. 6b) with respect to the SiC terraces. The graphene connecting the two electrodes is not visible, but is schematically outlined with bow tie lines as shown. The inner radius of the smallest circular branch of the antenna is about 5 microns and the spacing of the steps is about 1 micron.

Figure 7:
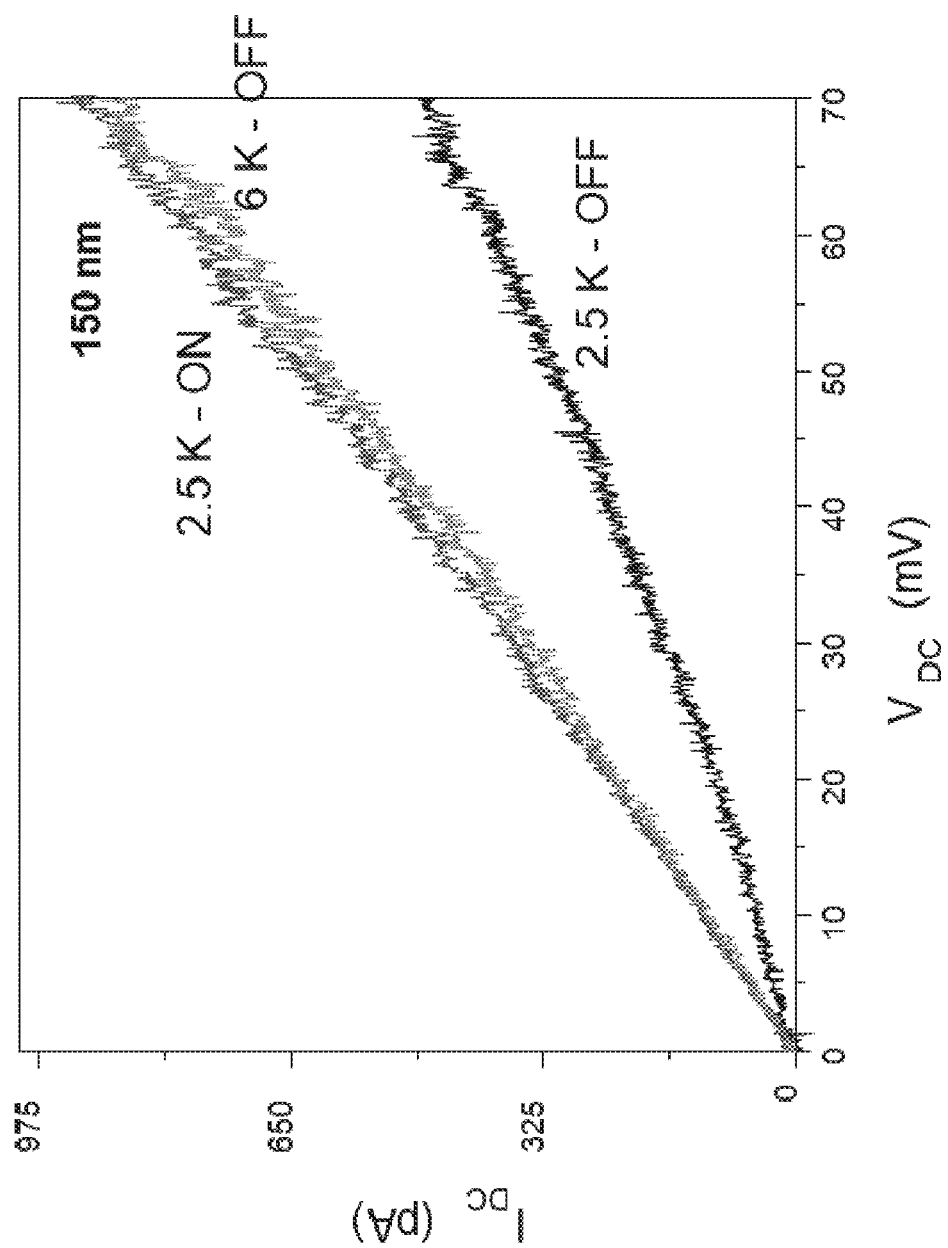
FIG. 7 illustrates a terahertz (IV) heating curve for a quantum dot in accordance with a particular embodiment.

Discussion on Joule Heating and THz Heating:

The change in the current voltage characteristics (IV curves) of the quantum dots due to THz radiation is very similar to the change caused by heating. FIG. 7 shows the IV curves of a 150-nm dot measured at 2.5 K with THz radiation OFF (black) and ON (red). In the same graph the IV curve of the same dot measured at 6K with THz radiation OFF is plotted. The 6K OFF curve matches the 2.5K ON curve quite well (the temperature of the 2.5K ON is only slightly higher), further supporting the bolometric detection mechanism.

Figure 8A:
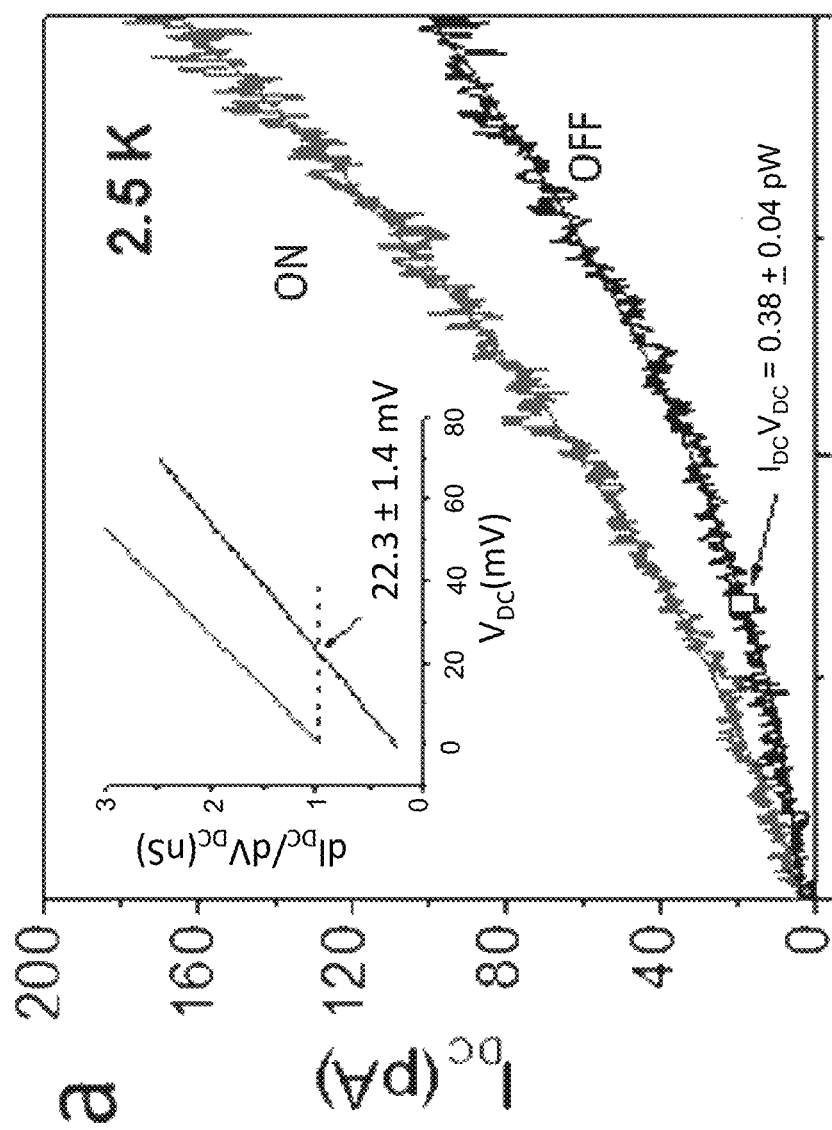
FIGS. 8a-8b illustrate a IV heating curve for a quantum dot in accordance with a particular embodiment.

In the quantum dot bolometer analysis, it was assumed that when the THz radiation is OFF, the nonlinearity of the IV curves is mainly due to Joule heating. This assumption is justified by further analyzing the IV curves of an embodied dot with radiation ON and OFF at different base temperatures, without changing the THz power. FIG. 8a shows the IV curves of the 30-nm dot with THz radiation ON (red) and OFF (black) at 2.5 K, that was presented in FIG. 2a. As described earlier, the differential conductance at zero bias of the curve with THz radiation ON is measured. This conductance is higher than the zero-bias differential conductance with radiation OFF, because the THz radiation is heating the device, as shown in FIG. 7. When the THz radiation is OFF, only Joule power is heating the device, causing an increase of differential conductance when the bias voltage is increased. If we assume that the non-linearity of the IV curve with radiation off is solely due to Joule heating, then we will need a value of Joule power as large as the THz power to cause an increase of differential conductance in the OFF curve that matches the increase produced by the THz radiation in the zero-bias differential conductance of the ON curve. The inset in FIG. 8a shows the differential conductance of the OFF and ON curve as a function of bias voltage. The zero-bias differential conductance of the ON curve matches the differential conductance of the OFF curve at the voltage bias $V_{DC}=22.3$ mV, corresponding to a Joule power of about 0.4 pW.

Figure 8B:
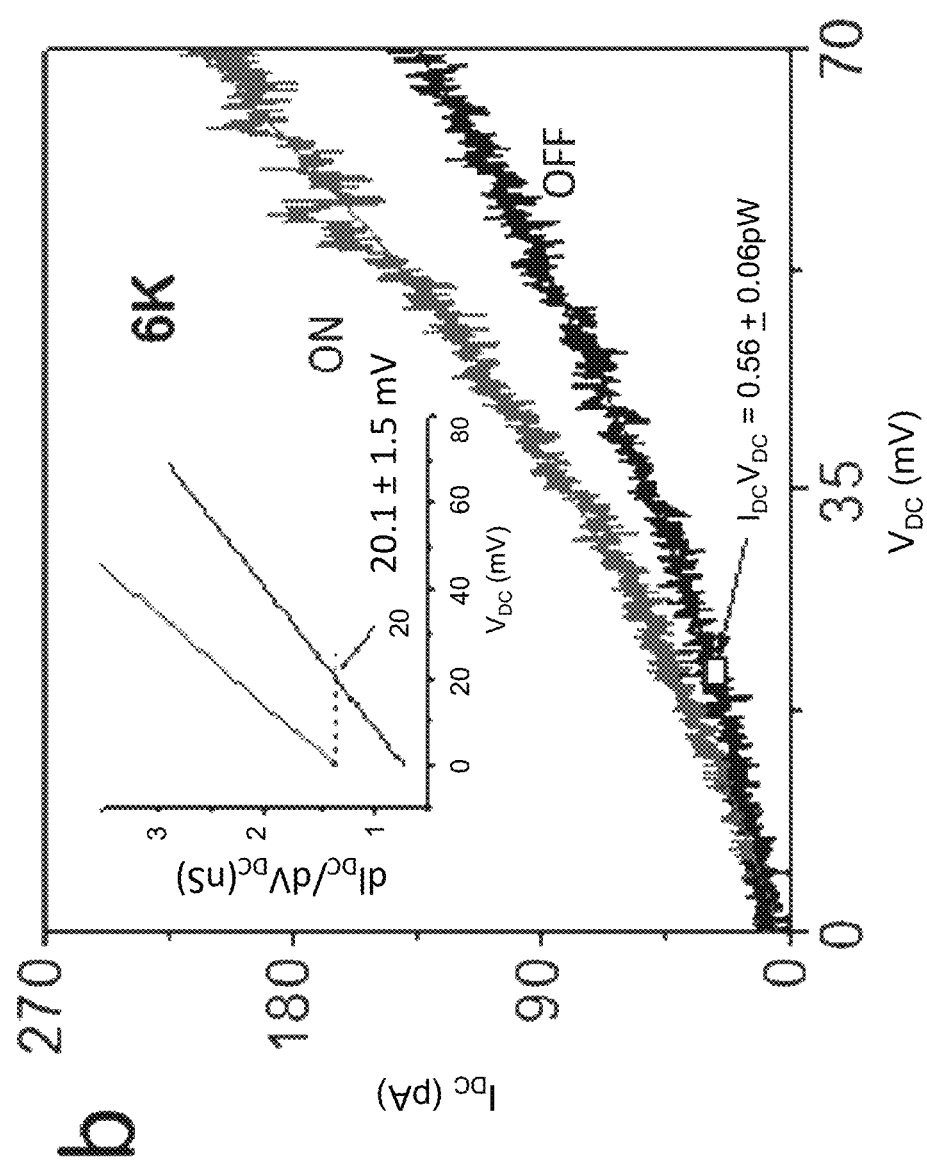

FIG. 8b shows the same analysis with the device temperature raised to 6K, without changing the THz power. If the non-linearity of the OFF curve is mainly due to Joule heating, we expect that the zero-bias differential resistance of the ON curve, corresponding to the device heated with THz radiation, should match the differential resistance of the OFF curve, with THz radiation OFF, at a bias point with Joule power that is approximately the same as the value measured at 2.5 K. The match of differential conductance occurs at a similar value, 0.56 pW. The two values differ by less than two standard deviations and the variation can be explained with variation of output power of the THz source with time, since the two measurements were taken a few hours apart (measuring dots of different size and orientation at one fixed temperature before heating the sample and test the devices at a higher temperature).

The insets in each graph of FIGS. 8a and 8b show the differential conductance as a function of bias for each curve and the bias point where the zero bias differential conductance of the curve with radiation ON matches the differential conductance of the curve with radiation OFF. Those bias points correspond to similar values of Joule power at different temperature, confirming that the nonlinearity of the OFF curves with radiation off is mainly due to Joule heating.

Heat Flow Diagram

Figure 9:
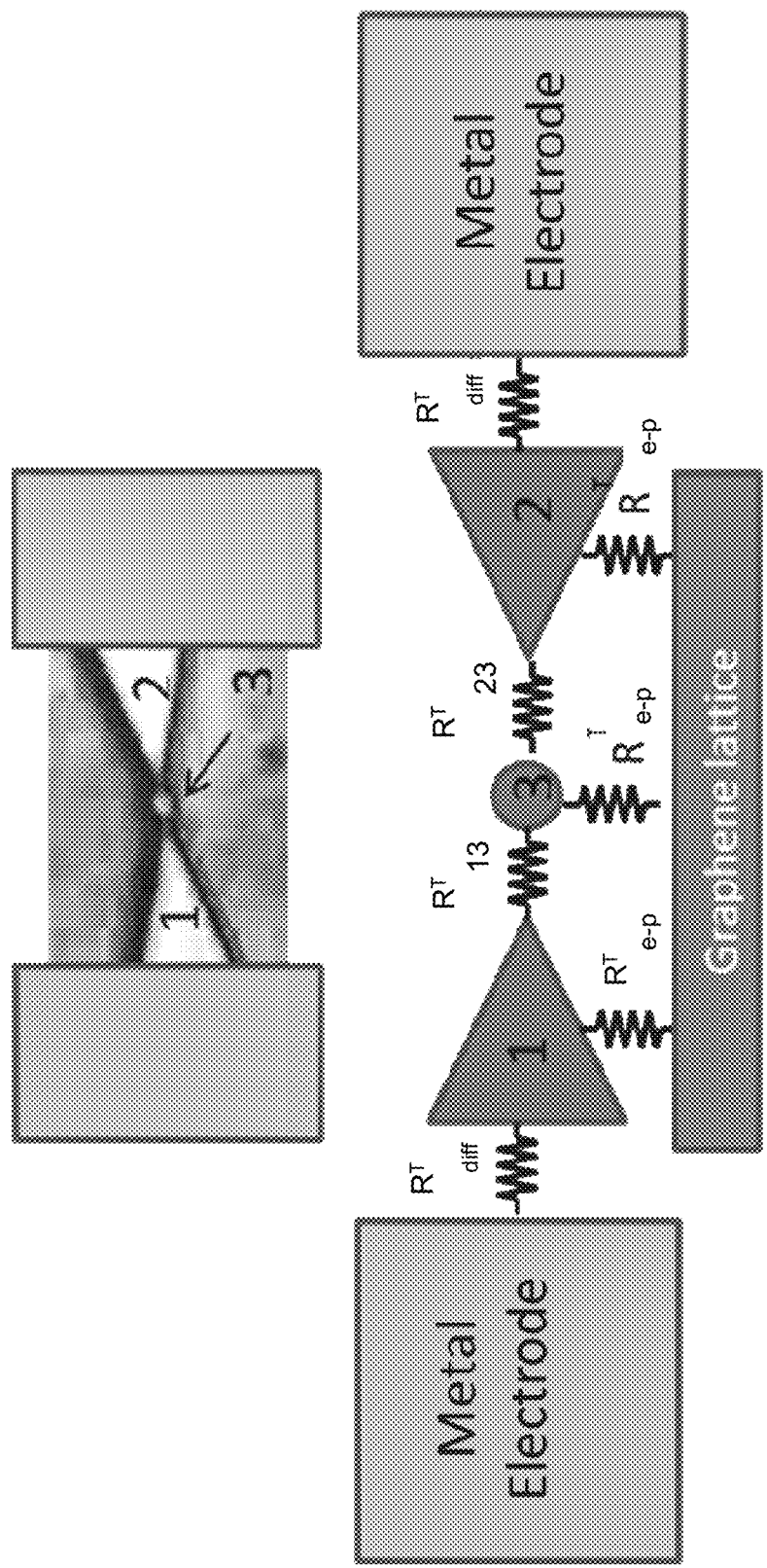
FIG. 9 illustrates a thermal model showing heat conduction paths for electrons in graphene.

FIG. 9 shows a basic schematic for the thermal circuit of our device. The graphene is made of three parts: two triangular shapes on each side of the dot, labeled 1 and 2 and the dot, labeled 3. In the thermal diagram we separated the graphene lattice, schematically shown, and the electrodes, shown as electron conduction path triangles 1, 2 and dot 3 for each part of the graphene area. It is estimated that the thermal resistance between the graphene lattice and the SiC substrate (not shown in the diagram) is very small compared to the other thermal resistances that represent cooling channels for the electron gas considered below and that, when thermal power is provided to the device, the graphene lattice and the metal electrodes are at the same bath temperature $T_0$, whereas the electrons equilibrate at a temperature $T_e > T_0$. The electron paths 1 and 2 of the device have two main cooling paths to the bath temperature: diffusion to the metal electrodes ($R^T_{diff}$) and phonon collisions ($R^T_{e-p}$). The dot (3 of the device) is thermally connected to parts 1 and 2 ($R^T_{13}$ and $R^T_{23}$) as well as to the lattice ($R^T_{e-p}$).

We use the Wiedemann-Franz law to estimate $R^T_{13}$, $R^T_{23}$ and $R^T_{diff}$. The sum $R^T_{13}+R^T_{23}$ is related to the large electrical resistance that we measure in our devices, since the constrictions on each side of the dot dominate the electrical resistance. For the smallest (30 nm) dots this resistance is as high as several hundreds of MΩ at a temperature of a few K. We cannot measure the electrical contact resistance related to $R^T_{diff}$ separately, but we can estimate that it is smaller than the room temperature resistance of the largest dot, 50 kΩ. From this we estimate that the thermal conductance due to diffusion to the electrodes is higher than $2.8 \times 10^{-12}$ WK$^{-1}$ by using the Wiedemann-Franz law (we assume that the variation of the electrical contact resistance with temperature is small).

We estimate the thermal conductance due to collisions with phonons using the result for monolayer graphene from the prior art:

$$G^T_{e-p} = 1/R^T_{e-p} = \frac{4\pi^2 D^2 |E_F| K_B^4 A T^3}{15 \rho \hbar^5 v_F^3 v_S^3} = 4\Sigma A T^3.$$

Here we considered the case where $T_e$ and $T_0$ are smaller than the Bloch-Grüneisen temperature of monolayer graphene, $T_{BG}$ (we do not know the doping of our graphene, but we estimate $T_{BG} \sim 70$ K for a reasonable value of charge density, $n = 10^{12}$ cm$^{-2}$). In the formula, we used a deformation potential D=18 eV (from ref. 28), the Fermi energy $E_F$=100 meV, a graphene area A=20 μm$^2$, the graphene mass density $\rho = 7.6 \times 10^{-7}$ kg m$^{-2}$, the Fermi velocity $v_F = 10^6$ ms$^{-1}$ and the sound velocity $v_s = 2 \times 10^4$ ms$^{-1}$, yielding $G^T_{e-p} = 4 \times 10^{-12}$ WK$^{-1}$ at T=1 K and an electron-phonon coupling constant $\Sigma = 50$ mW m$^{-2}$ K$^{-4}$. The thermal conductance extracted from our electrical measurements in FIG. 2d is $G_{TH} \sim 7 \times 10^{-12}$ WK$^{-1}$ at 6 K, yielding $\Sigma = 0.4$ mW m$^{-2}$ K$^{-4}$, lower than the estimated value but similar to other values previously reported. Although these are just rough estimates (we do not know the doping level of graphene and we cannot measure the contact resistance separately) and it is also likely that the defects due to nanopatterning contribute to deviations from these estimates (in previous work, lattice disorder has been suggested as a possible cause for the reduction of electron-phonon coupling by more than one order of magnitude), the value of thermal conductance extracted from the measurements compares well to the estimated value and values reported in other studies.

Methods

Epitaxial Graphene Synthesis

Epitaxial graphene synthesis was accomplished via Si sublimation from semi-insulating (0001) 6H—SiC substrates misoriented ca. 0.4° from the basal plane under a 100 mbar Ar pressure in a commercial chemical vapor deposition reactor. The substrates were etched by $H_2$ prior to graphene synthesis. The terraces of the sample were nominally one layer of graphene bounded by steps that were 2 layers. Before device fabrication, the room temperature carrier sheet density and mobility of the 8 mm×8 mm samples shown here were $-7.8 \times 10^{12}$ cm$^{-2}$ and 790 cm$^2$ V$^{-1}$ s$^{-1}$, respectively.

Base Device Fabrication

The process was adapted from that developed by Yang et al. to use e-beam lithography, instead of photolithography. As a first step, sputter deposited a 30-nm metallic layer (Pd or Au) directly on graphene. This layer prevents any contamination due to the photo-resist during processing. Next spin a polymethyl methacrylate/MMA bilayer on the metal and write the dot pattern by e-beam lithography (we used a Zeiss SUPRA55-VP with NPGS), with the shape shown in the inset in FIG. 1a (we define the dot pattern as the dot in the center with the two triangular shapes attached to it on both sides). Then we sputter deposit a 50-nm-thick layer of Pd and remove this Pd layer around the dot pattern by lift off, so that the metallic layer on the dot pattern is thicker (30 nm+50 nm) than the metallic layer around it, which is only 30-nm thick. The next step is dry etching of the 30-nm metallic layer around and on top of the dot pattern, using Ar plasma (50 SCCM, 80 W, with Oxford Plasmalab 80) for 90 seconds. This step leaves about 50-nm thick metal on top of the dot pattern and no metal around it. The metal on the dot pattern works as a mask to protect the graphene underneath in the subsequent steps. Then we etch any graphene left around the dot pattern by $O_2$ plasma (50 SCCM, 10 W, with Oxford Plasmalab 80) for 60 seconds. Next we pattern the source and drain electrodes by e-beam lithography, followed by sputtering of Cr(3 nm)/Au(150 nm) and lift-off. The 50-nm metallic layer (Pd or Au) covering the dot pattern is removed in the last fabrication step, using aqua regia ($HNO_3$:HCl:$H_2O$=1:3:4) for 20 seconds.

Q-Dot Bolometers: Gates, Antennas and Surface Engineering of the Substrate

In an alternative embodiment, a gate electrode is couple to the embodied bolometer to be able to perform spectroscopy studies of the dot and quantify the characteristic energies. This is done by measuring the Coulomb blockade diamonds in the plots of conductance as a function of source-drain voltage and gate voltage. This has been done on graphene quantum dots that were fabricated with flakes of exfoliated graphene, whereas quantum dots made with epitaxial graphene on SiC have not been explored. Two types of gate designs: top gates and side gates may be used. In previous work top gates were fabricated on carbon nanotube quantum dots and for a different type of device made with graphene on SiC. One successful approach for the fabrication of the gate dielectric is to sputter a seed layer of $Al_2O_3$ before the atomic layer deposition of a thicker layer.

One problem with the top gate is that it will partially block THz radiation, therefore for these devices THz radiation is introduced from the bottom side of the SiC substrate. Both the top gates and the side gates will change the charging energy of the dot with respect to the ungated devices, but will provide an important diagnostic tool to study the dots. In the case of side gates, the THz radiation is not blocked and the quantum dots can be used as bolometers testing incident light from both sides of the SiC substrate. By varying the voltage applied to the side gate one can tune the alignment of the Fermi energy with respect to the confinement gap in the dot, therefore tuning the activation energy. This will drastically affect the responsivity of the dot.

Figure 10B:
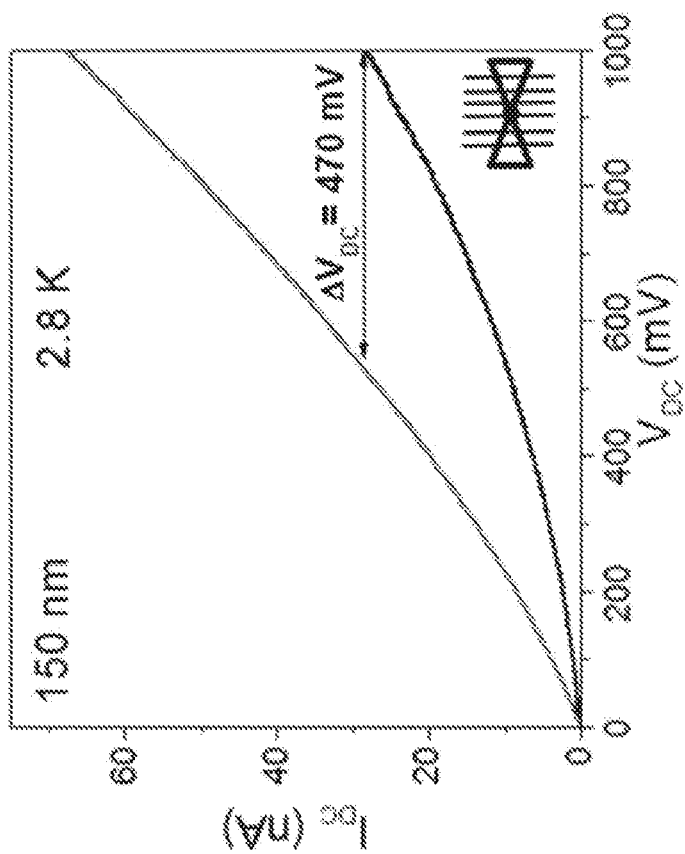
FIGS. 10a-10b illustrate response of graphene quantum dots in a particular embodiment.
Figure 10A:
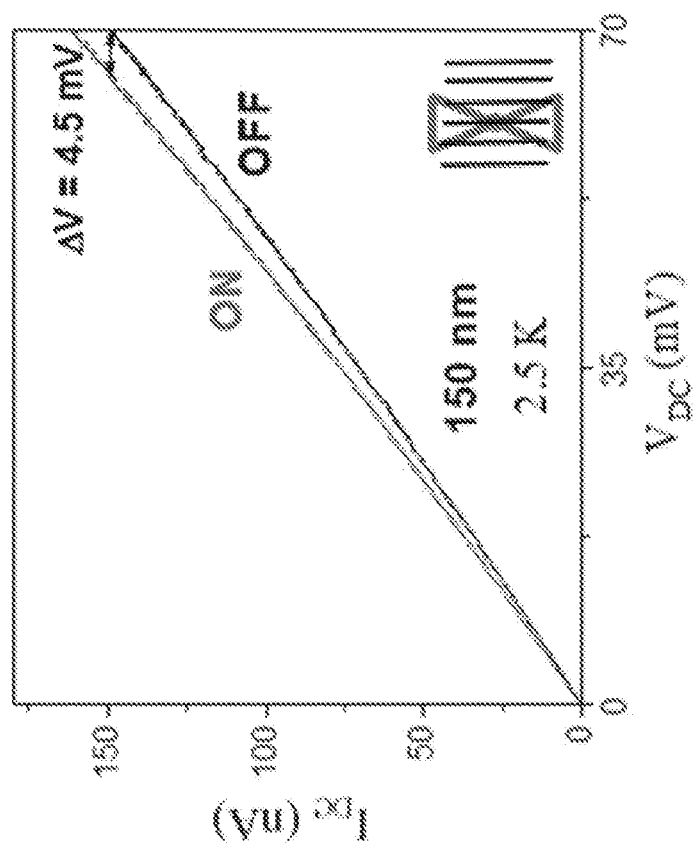

The effect of the substrate on the dots and their characteristic energies extracted from the Coulomb blockade diamonds may also be determined. Previous work shows that the activation energies of the dots strongly depend on the orientation of the dots with respect to the steps on the SiC surface. FIG. 3b shows that when the current flows perpendicular to the steps, the activation energies are shifted to higher values, suggesting that the steps produce a potential barrier for the flow of current that contributes to the activation energy. This contribution is quite important because it strongly affects the quantum dot bolometer performance, as shown in FIGS. 10a and 10b. FIG. 10a shows the response of graphene quantum dots to 0.15 THz radiation for dots with the same diameter as the dot in FIG. 3c and different orientation with respect to the SiC steps.

It also offers the possibility to artificially create steps in the substrate before graphene growth to control the height of the potential barrier and increase the device response. Steps of different heights may be etched on the substrate, before graphene growth, to test their effect on the transport properties and the THz response of the dots.

Finally, previous work characterized the bolometric performance based on the power absorbed by the device. The present embodiments describe how to optimize the coupling of incident radiation to the device. One issue is that the quantum dots have high impedance and there is a large impedance mismatch to overcome in order to increase the amount of incident radiation coupled to the dot.

In a present embodiment, antennas are attached to the source and drain electrodes. The antenna will both increase the detection area and reduce the impedance mismatch. FIGS. 6a and 6b show an example of the antenna concept, with FIG. 6b illustrating results from an exemplary log-periodic broad band antenna embodiment. With a broadband antenna the bolometer response as a function of frequency may be determined. For example, the response may change at a threshold photon energy matching the activation energy of the dots. Additionally, device impedance may be reduced by patterning multiple dots in parallel.

The bias conditions may be optimizes to obtain the highest responsivity. FIG. 10b shows that for the same device that is shown in FIG. 3c exposed to the same incident power, the voltage signal $\Delta V$ is much higher (472 mV vs. 32 mV) when the device is biased at $V_{DC}$=1V compared to the same device biased at $V_{DC}$=70 mV.

Quantum Dot Bolometers for Molecular Magnet Spectroscopy.

Graphene may be used both as a template to graft single-molecule magnets (SMMs) on its surface and as a bolometer for sensitive spectroscopy of these molecules.

SMMs are potentially a nanoscale realization of spintronics systems, where charge and spin can be manipulated at the single-molecule level. They are attractive for information storage, because of their extremely long magnetization relaxation time (years at temperatures below 2K) and for quantum computing, because of their long coherence times (microseconds at 2K). In addition, the distance and interaction strength between the neighboring qubits in SMMs can be very precisely controlled.

High frequency electron paramagnetic resonance, HFEPR, may be used to probe the electronic energy levels of SMMs. Similarly to EPR, the basic principle is to expose the molecules to electromagnetic radiation and measure their absorption spectrum in the presence of magnetic field, while sweeping the frequency at different temperatures. In HFEPR however, the frequencies are higher than 100 GHz, therefore this technique is not a straightforward extension of EPR. The higher frequency range requires fundamental changes in the instrumentation to deal with the generation and propagation of radiation at frequencies well above the microwave range. Since the options of powerful THz sources and sensitive THz detectors are quite limited and the source and the detector are typically both outside the cryostat and far away from the sample, this technique is quite challenging, albeit very powerful.

A High-Frequency Electron Spin Paramagnetic Resonance/Frequency Domain Magnetic Resonance (HFESR/FDMR) spectrometer, which is a very sensitive ($10^7$ spins/(gauss·Hz$^{1/2}$) and very versatile spectrometer operates seamlessly in a very broad frequency range from 85 GHz to 1100 GHz, at high magnetic fields up to 17 T and temperatures from 300 K down to 1.8 K. The electromagnetic wave is propagated with minimal losses due to the use of quasi-optical components adapted from satellite communications. Detection is done with a helium-cooled InSb hot-electron bolometer. According to prior art publications, using this system, several SMMs have been measured, including dysprosium(III) ions, transition metal complexes and $Fe^{III}_4$.

Magnetic molecules are composed of a magnetic core that is covered by organic ligands to facilitate attachment to surfaces. The ligands can be designed to attach the molecules to graphene to possibly achieve monolayer coverage. The feasibility of this approach has already been discussed in previous work, with the proposal to attach magnetic molecules to carbon nanotube quantum dots. If the magnetic molecule is weakly coupled to the nanotube, a spin flip induced by an applied magnetic field can be detected by a change in the current through the dot as a non-destructive readout.

In accordance with the embodiments discussed herein, by grafting magnetic molecules directly to the whole graphene area, i.e., the triangular areas 1 and 2 as well as the dot 3 in FIG. 9, may be used as a very sensitive bolometer for spectroscopy. It is expected that the graphene will not perturb the intrinsic property of the molecules, because the coupling will be weak. Nevertheless, the molecules will be just a few nanometers away from the bolometer, allowing spectroscopy of the molecules with unprecedented sensitivity. We expect a change in the THz absorption of the graphene quantum dot at frequencies with photon energy that matches the electronic level spacing of the magnetic molecules. This change can be readily measured as a change in the current-voltage characteristics of the quantum dot.

In a further embodiment, molecules may be selectively attached in the dot. Selective grafting of the molecules on the dots can be done by using e-beam lithography to cover the triangular parts of the graphene on each side of the dot with a chemically inert polymer, SU8. This technique may be used to study the gas sensing mechanism of carbon nanotubes and passivate the contact area, to be able to expose just the middle of the nanotubes to the gas. These samples allow for study of the effect of the molecules on the transport properties of the dot, by using side gates to measure Coulomb blockade diamonds with and without a magnetic field applied.

Graphene/MoS$_2$ Hybrid Structures

In the graphene THz sensor described above, the quantum dot provides a potential barrier via the quantum confinement gap. Thermal activation over this barrier produces the strong temperature dependence of the electrical resistance for the current of hot electrons generated in the graphene areas attached to the right and left side of the dot (these areas are labeled 1 and 2 in the SEM image in FIG. 9).

In an alternative embodiment, a different way to build an activation barrier for graphene THz bolometers is achieved. Graphene/MoS$_2$ junctions are fabricated and create a Schottky barrier at the interface between the graphene and the MoS$_2$. This type of device is attractive for multiple reasons. First, it can provide larger activation barriers yielding a stronger temperature dependence at temperatures closer to room temperature (the MoS$_2$ bandgap is about 2 eV and the barrier will depend on the workfunctions of graphene and MoS$_2$, therefore on their doping). Second, MoS$_2$ has been shown to be a good hot electron acceptor, because it exhibits internal photogain and high photoresponsivity. Third, this hybrid structure can be used as a photosensor also at frequencies with photon energy larger than the bandgap of MoS$_2$, where the MoS$_2$ is also a photoactive material. Schottky barrier graphene/MoS$_2$ solar cells have in fact been predicted to have power conversion efficiencies 1-3 orders of magnitude higher than the best existing commercial solar cells reduced to the same thickness.

Graphene/$MoS_2$ structures based on exfoliated flakes have been investigated by a few groups, in all cases with multilayer $MoS_2$ and mainly for photodetection of visible light or for infrared detection using hot electrons generated by plasmonic antennas. Here single layer $MoS_2$ is used and transferred to graphene previously patterned on SiC. These heterostructures may be used for detection in the THz frequency range, from the hot electrons excited in the graphene, as well as for detection in the visible range.

Figure 11A:
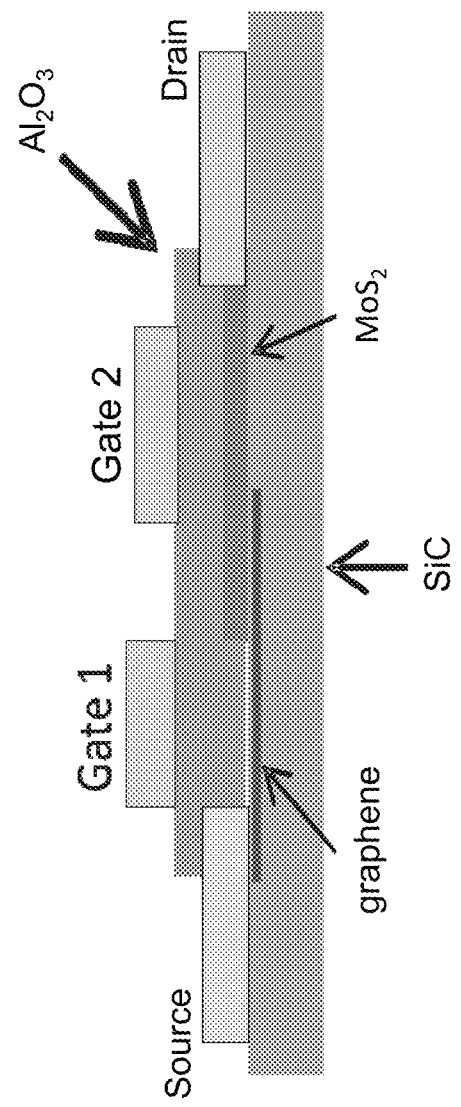
FIG. 11a-11c illustrates Raman spectrum of MoS$_2$ in a particular embodiment.
Figure 11B:
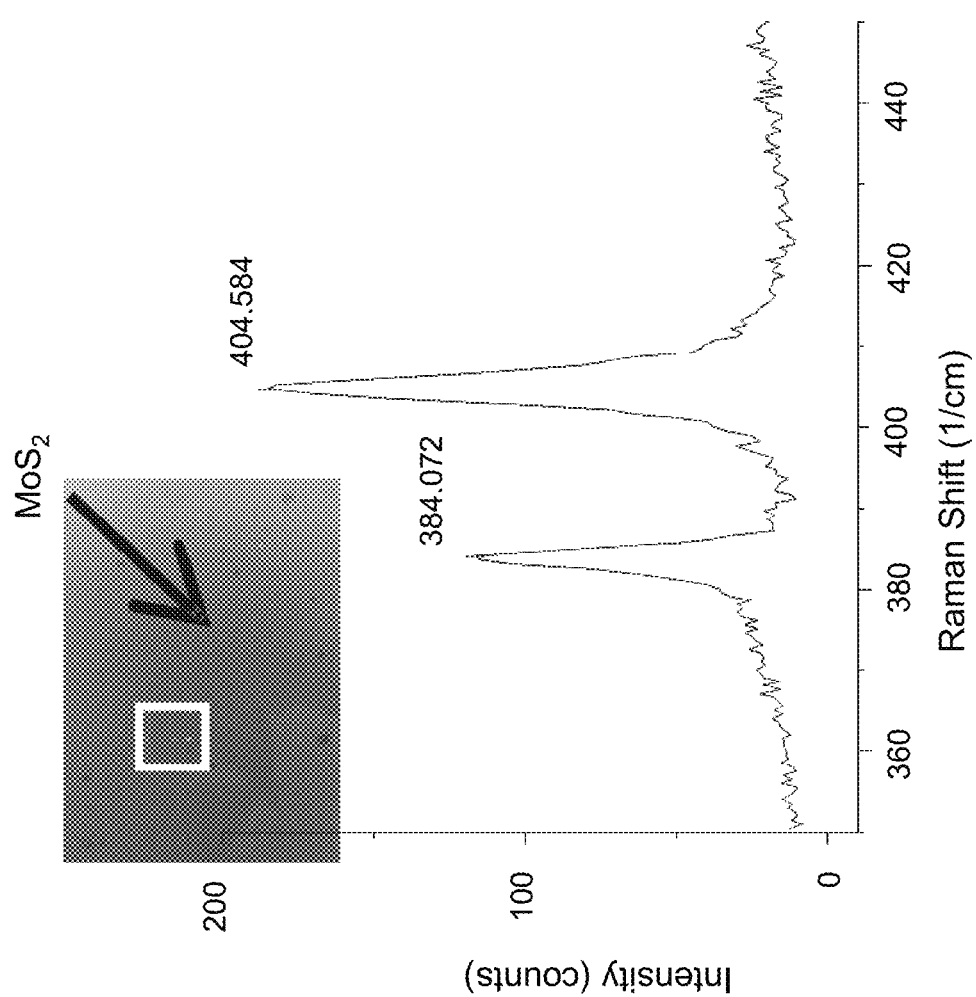
Figure 11C:
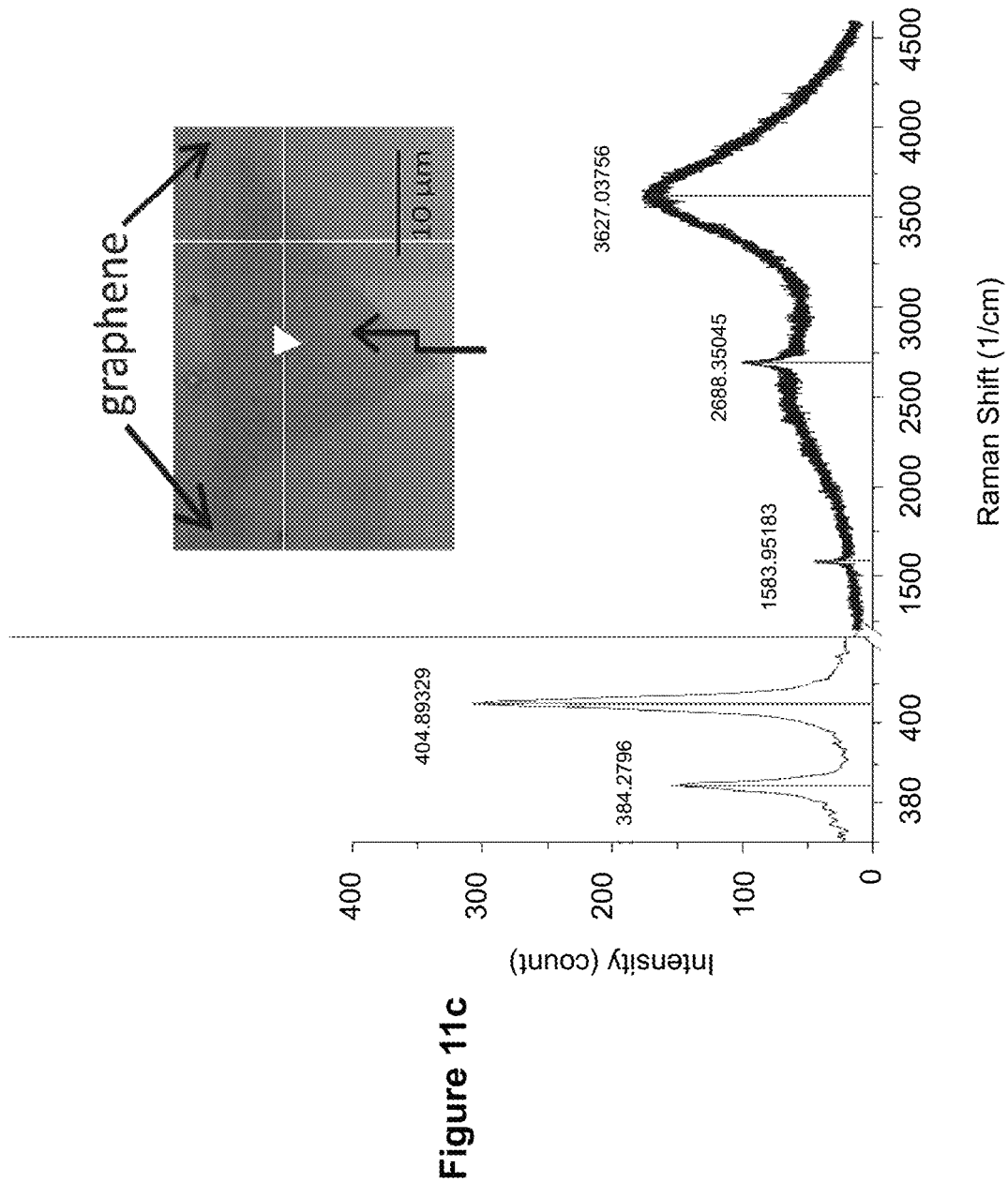

Large-area $MoS_2$ monolayer films (hundreds of micrometers) may be grown, as shown in FIGS. 11a-11c, as well as large-area monolayer flakes (tens of micrometers). Referring to the schematic of FIG. 11a, first graphene is patterned on SiC, followed by a monolayer $MoS_2$ to obtain an overlap region between the graphene and the $MoS_2$. Aligning $MoS_2$ flakes grown by CVD between graphene electrodes may be used. For these heterostructures, graphene grown by CVD on Cu films and transferred on Si/$SiO_2$ substrates is used (one example is shown in the optical image and Raman spectrum of the heterostructures shown in FIGS. 11b and 11c). Metallic contacts are attached to the $MoS_2$ and the graphene. As last steps, a dielectric layer and at least one top gate are deposited. The gated Schottky junctions are used to measure the band alignment between the graphene and the $MoS_2$ and how this alignment is affected by the gate. Multiple gates provide the option to gate either just the graphene or the whole heterostructure. One example of a structure with two gates, Gate 1 and Gate 2, is in FIG. 11a.

FIG. 11b shows an inset optical image of a monolayer of $MoS_2$ with the white square providing scale, each side thereof being approximately 12 microns. The spectrum is Raman spectrum for monolayer of $MoS_2$. FIG. 11c shows inset optical image of CVD-grown $MoS_2$ monolayer flake (large triangle approximating boundary thereof) with smaller triangle therein is bilayer $MoS_2$. The spectrum is Raman spectrum from the graphene/$MoS_2$ overlap area at the point where lines intersect on inset optical image.

The band alignment may be different depending on the doping of the graphene. As-grown graphene on SiC is n-doped, whereas hydrogen-intercalated graphene is p-doped, leading to different Schottky barriers. Appropriate metallic contacts to the graphene are selected and the $MoS_2$ made of different materials, with different workfunctions to obtain an asymmetric build-in potential that will separate electrons and holes. In previous work photovoltaic cells using multilayer $MoS_2$ contacted by different materials are described, so a similar fabrication technique may be applied to these graphene $MoS_2$ Schottky junctions.

Gated and ungated devices may be fabricated on the same chip to test detection of radiation either from the top surface or the bottom surface of the SiC chip.

$MoS_2$ Nanoribbons as Photodetectors.

There has been a lot of work on photodetectors based on monolayer as well as multilayer $MoS_2$, including work by Applicant. Even for a monolayer, the highest responsivity is quite impressive, 880 $AW^{-1}$, with NEP lower than commercial photodiodes. In addition to the cited non-patent references, attention is drawn to U.S. Pat. No. 8,766,330 entitled "Method and system for generating a photo-response from $MoS_2$ Schottky junctions" which is incorporated herein by reference for its relevant teachings.

In the present embodiments, performance of $MoS_2$ can be improved by further exploiting quantum confinement. Decreasing the thickness from multilayer to single layer already increases the conversion efficiency from light to current because the electronic band gap changes from indirect to direct. Further quantum confinement may yield even higher responsivity.

When $MoS_2$ layers are patterned into nanoribbons, the electronic charges are confined in one dimension, along the nanoribbon. The density of states will change substantially, with new van Hove singularities at the onset of the one-dimensional subbands, with spacing determined by the width of the nanoribbons. Van Hove singularities with a divergent density of states are a hallmark of low dimensional systems. There are very few studies on the effects of the increased density of states and the enhancement of electronic interactions on the transport properties of materials. We previously studied transport at van Hove singularities in carbon nanotubes and their connection to the onset of intrinsic superconductivity. Here, the focus is on the effect of van Hove singularities on the photoresponse of $MoS_2$. Specifically, it is predicted that van Hove singularities will strongly increase light-matter interaction in these materials.

The photoresponse of transistors made from monolayer $MoS_2$ films may be compared to the photoresponse of $MoS_2$ with the same active area, but patterned in the shape of nanoribbon arrays connected in parallel. We pattern the $MoS_2$ nanoribbons using the same fabrication techniques that we used to pattern graphene quantum dots discussed herein. We use monolayer films grown by CVD and pattern several devices on the same chip with comparable photoactive area, with and without nanoribbon arrays. Because these samples will be obtained from the same large-area film, showing uniform Raman spectrum and with the same doping level (the doping is not controlled and can in principle be different for flakes exfoliated from geological crystals), this type of experiment directly compares the effect of nanopatterning and van Hove singularities on the photoresponse.

Additional contemplated embodiments include modifications to the bolometers described herein, including but not limited to replacing the graphene quantum dot with a semiconducting material. The bandgap of the material will produce the energy barrier necessary for the thermal activation behavior and the strong temperature dependence of the resistance.

Figures 12A, 12B:
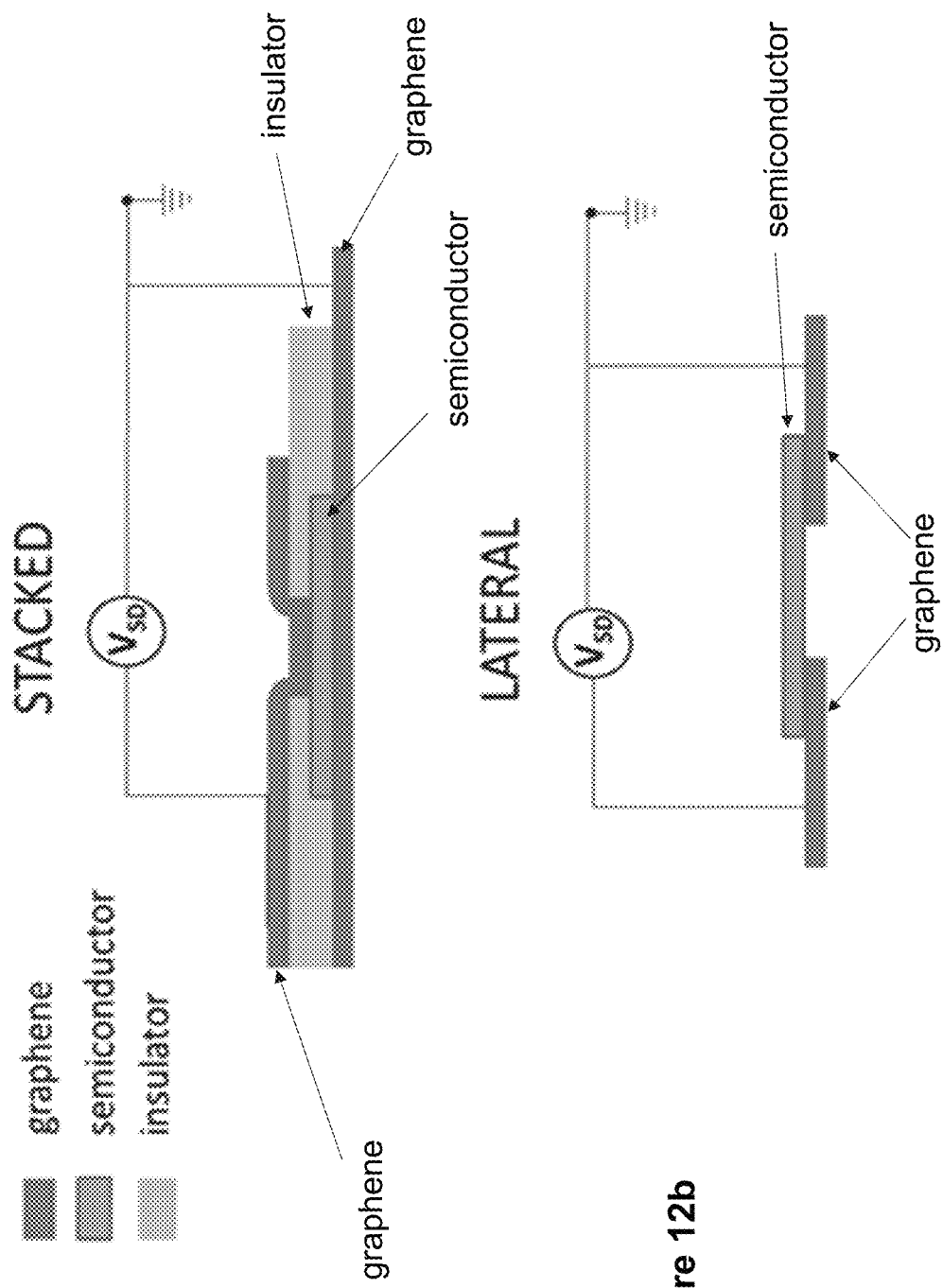
FIGS. 12a and 12b illustrate bolometer configurations incorporating MoS$_2$ in accordance with various embodiments.

In the vertical layout, the semiconducting material, e.g. $MoS_2$, will be placed on top of the graphene layer and then another graphene layer will be deposited on top of the semiconducting material. An oxide layer may be used to define the area of the stacked graphene/semiconductor junctions. In the lateral layout, the graphene and the semiconducting layer are attached side by side. FIGS. 12a and 12b are illustrative.

Figure 13:
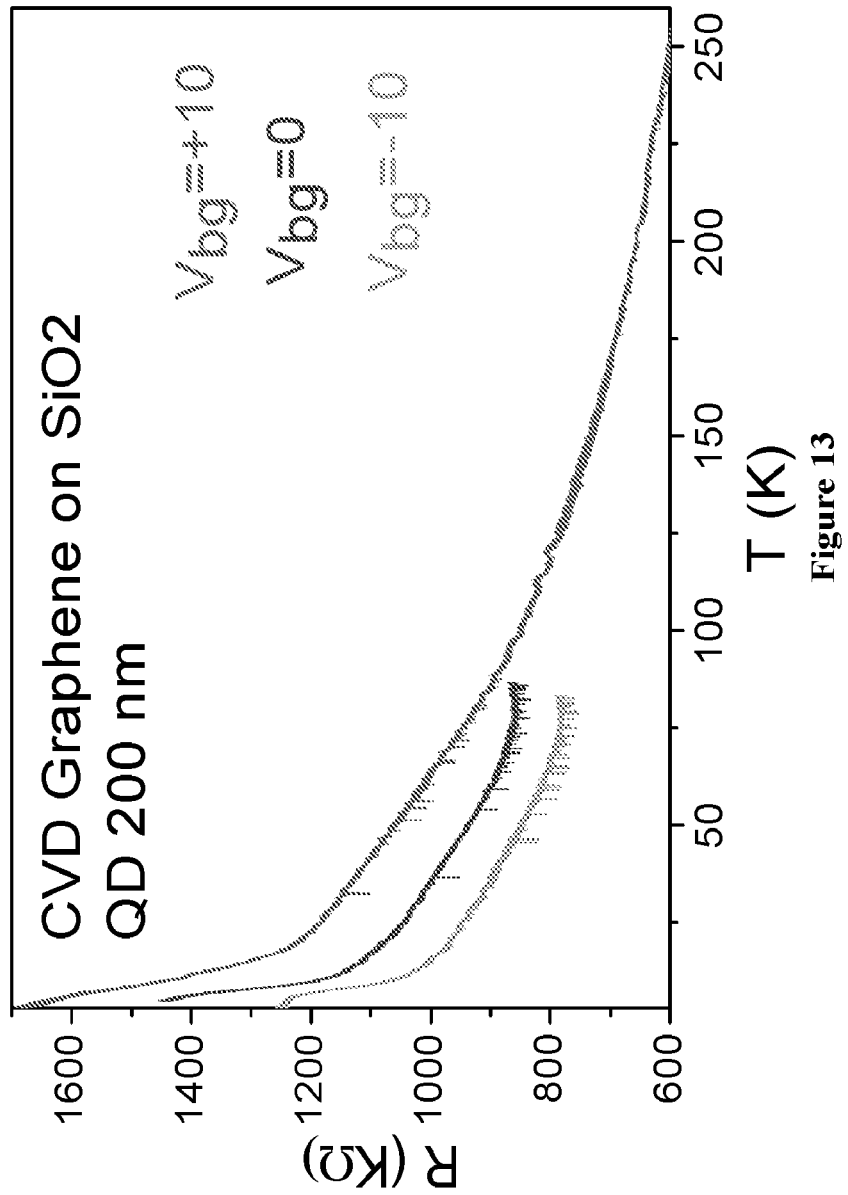
FIG. 13 illustrates response of quantum dot device in presence of gate electrode.

For embodiments including gates, gate dependence of R(T) has also been investigated to determine the effect (if any) of the gate(s) on the quantum dot devices. FIG. 13 shows results from an exemplary 200 nm graphene quantum dot device fabricated with graphene grown by chemical vapor deposition (CVD) and transferred on a doped silicon (Si) substrate capped with 300 nm of $SiO_2$. The doped silicon substrate is used as a back gate. The temperature dependence of the resistance as a function of the back-gate voltage is shown in FIG. 13. The back-gate voltage shifts the Fermi energy of the source and drain electrode with respect to the confinement gap of the dot, thereby changing the activation energy for the current flowing through the dot. For the exemplary device, the curve corresponding to a back-gate voltage $V_{bg}=10$ V shows a much stronger temperature dependence of the resistance. These preliminary results show that the device performance can be greatly improved by applying a gate voltage. For devices fabricated using epitaxial graphene on SiC, the gate voltage can be applied with a gate electrode patterned on the side of the quantum dot. Additional degrees of freedom may be achieved with the addition of side gates to the graphene devices fabricate on SiC.

Figure 14:
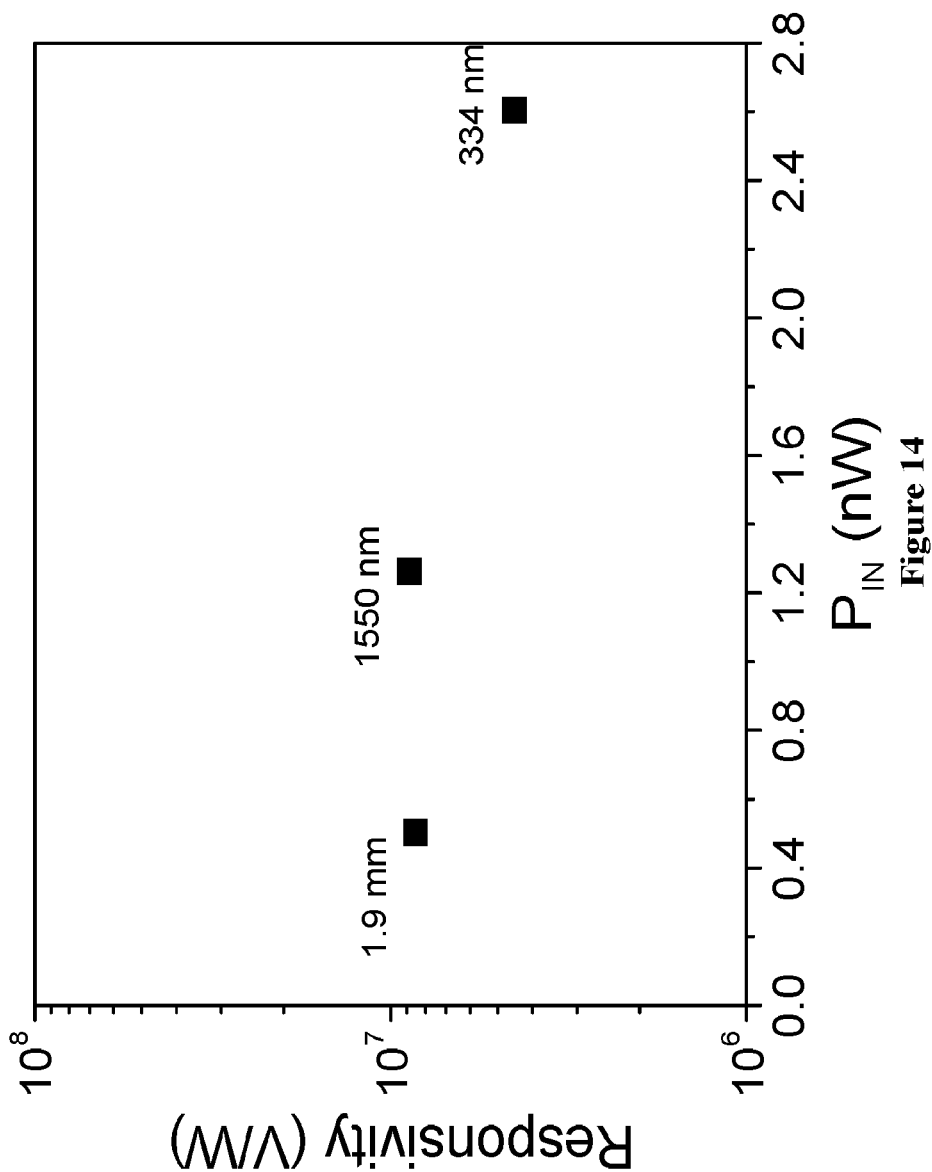
FIG. 14 illustrates quantum dot device responsiveness across range of frequencies.

Additionally, referring to FIG. 14, it has been determined that the graphene quantum dot bolometers work on a very wide frequency range, including visible and UV light and are in no way limited to operation at the 0.15 THz (1.9 mm) described above. FIG. 14 shows the responsivity of a 200 nm dot to electromagnetic radiation of different wavelengths.

Figure 15:
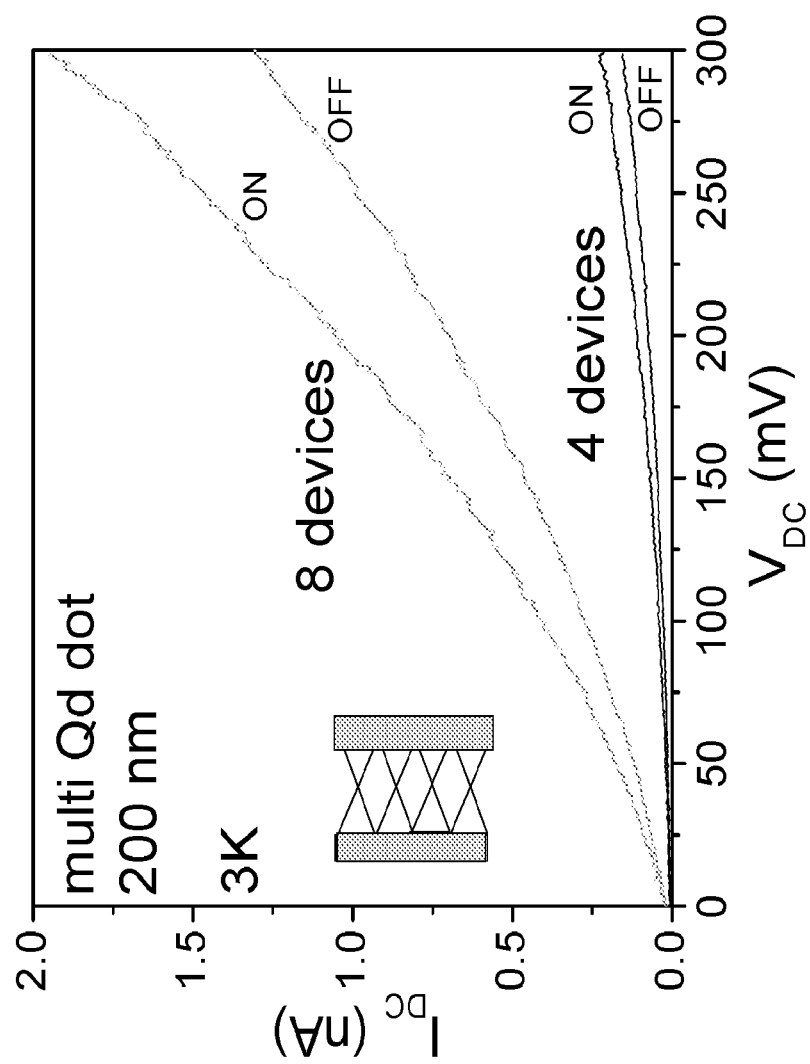
FIG. 15 illustrates response of multi-quantum dot array devices.

Further still, arrays of quantum dots are also contemplated by the embodiments herein. A detector array has a larger active area and smaller impedance. FIG. 15 shows the response for arrays with 4 and 8 dots connected in parallel.

Other variations include: modifying the substrate to further control the potential barriers for the thermally activated current; to add steps that act as small potential barriers the substrate is patterned or the wafer is purchased with an orientation at a specified angle; adding an electrostatic gate to tune the height of potential barrier that produces the thermally activated behavior; and increasing absorption of incident radiation in the graphene either by adding absorbing material to the graphene, or by exploiting plasmonic resonances in the graphene.

One skilled in the art recognizes the variations to the embodiments and features described herein which are clearly within the skill of the art. Such variations are considered to be within the scope of this description.

We claim:

1. A hot-electron bolometer comprising:
a SiC substrate;
a radiation detection area including a quantum dot pattern of epitaxial graphene formed on the SiC substrate; and
a source electrode and drain electrode contacting the quantum dot pattern.

2. The hot-electron bolometer of claim 1, wherein the source electrode and the drain electrode are formed of graphene and layers of Cr and Au.

3. The hot-electron bolometer of claim 1, further comprising an antenna coupled thereto.

4. The hot-electron bolometer of claim 1, wherein the quantum dot pattern includes a quantum dot having a diameter approximately equal to or less than 200 nm.

5. The hot-electron bolometer of claim 1, wherein the SiC substrate surface includes basal plane terraces bounded by steps.

6. The hot-electron bolometer of claim 5, wherein the quantum dot pattern is arranged such that current flow is perpendicular to the steps of the SiC substrate surface.

7. The hot-electron bolometer of claim 1, further comprising at least one gate electrode.

8. The hot-electron bolometer of claim 7, wherein the at least one gate electrode is formed on at least part of the quantum dot pattern.

9. The hot-electron bolometer of claim 1, further comprising magnetic molecules grafted to the quantum dot pattern.

10. The hot-electron bolometer of claim 1, further comprising multiple quantum dot patterns connected in parallel formed on the SiC substrate.

* * * * *